United States Patent [19]
Tsukada et al.

[11] Patent Number: 5,710,693
[45] Date of Patent: *Jan. 20, 1998

[54] ELECTRONIC DEVICE HAVING A FLAT, CARD-LIKE CASING ENCLOSING COMPONENTS FOR A COMPLETE COMPUTER SYSTEM INCLUDING A SUB-PRINTED WIRING BOARD ATTACHED TO AN INNER SURFACE OF THE CASING AND ELECTRICALLY CONNECTED TO A PRINTED WIRING BOARD BY A FLEXIBLE MEMBER

[75] Inventors: Katsumi Tsukada; Norio Nakamura; Minoru Nimura; Hiroyuki Suemori; Tomio Kamihata; Mutsuaki Yamazaki, all of Suwa, Japan

[73] Assignee: Seiko Epson Corporation, Tokyo, Japan

[*] Notice: The term of this patent shall not extend beyond the expiration date of Pat. No. 5,481,432.

[21] Appl. No.: 439,880

[22] Filed: May 12, 1995

Related U.S. Application Data

[62] Division of Ser. No. 151,214, Nov. 12, 1993, Pat. No. 5,481,432.

[30] Foreign Application Priority Data

| Nov. 13, 1992 | [JP] | Japan | 4-304060 |
| Nov. 13, 1992 | [JP] | Japan | 4-304062 |
| Nov. 13, 1992 | [JP] | Japan | 4-304063 |
| Nov. 13, 1992 | [JP] | Japan | 4-304064 |
| Feb. 19, 1993 | [JP] | Japan | 5-054843 |
| Jun. 15, 1993 | [JP] | Japan | 5-169695 |
| Nov. 8, 1993 | [JP] | Japan | 5-278643 |

[51] Int. Cl.$^6$ .............. G06F 1/16; H05K 7/10; H01R 13/64
[52] U.S. Cl. ............... 361/686; 361/684; 361/737; 361/736; 361/796; 439/637; 439/680
[58] Field of Search .............. 174/268; 361/684, 361/686, 728, 736, 737, 749, 752, 789, 790, 796; 257/735, 787

[56] References Cited

U.S. PATENT DOCUMENTS

| 4,211,919 | 7/1980 | Ugon . | |
| 4,295,041 | 10/1981 | Ugon . | |
| 4,849,944 | 7/1989 | Matsushita | 439/924 X |
| 4,858,071 | 8/1989 | Manabe et al. | 361/749 X |
| 4,996,766 | 3/1991 | Piorunneck et al. | 439/637 X |
| 5,003,273 | 3/1991 | Oppenberg | 333/1 |
| 5,130,781 | 7/1992 | Kovac et al. | 257/735 X |
| 5,170,326 | 12/1992 | Meny et al. | 361/749 X |
| 5,242,310 | 9/1993 | Leung | 361/737 X |
| 5,253,010 | 10/1993 | Oku et al. | 361/749 X |
| 5,309,326 | 5/1994 | Minoru | 361/790 |
| 5,311,403 | 5/1994 | Tanuma et al. | 361/752 X |
| 5,319,516 | 6/1994 | Perkins | 361/737 X |
| 5,331,509 | 7/1994 | Kikinis | 361/686 |
| 5,583,375 | 12/1996 | Tsubosaki et al. | 257/787 X |

OTHER PUBLICATIONS

"386SL CPU Board Measures 4 By 4 In." *Electronic Design*, 131 Aug. 5, 1993.

*Primary Examiner*—Michael W. Phillips
*Attorney, Agent, or Firm*—Oliff & Berridge

[57] ABSTRACT

A thin and small computer system that can be used generally for control of equipment or the like, includes a CPU chip, peripheral control chips, and other components mounted in the form of a bare chip, whereby a computer system having a so-called hierarchy architecture can be incorporated in an IC card-like casing. Computer system components are affixedly attached to a double-sided printed wiring board. Electronic components may be attached to the printed wiring board in a bare form and then at least partially sealed with a resin. A system may further include a second printed board which is independent from the first printed board and adhesively attached to a inner surface of the casing and connected to the first printed board by a flexible member. In addition the second circuit board may include structure which enables it to connect to an apparatus for programming an electronic component attached thereto.

2 Claims, 22 Drawing Sheets

| 1 | GND | 119 | GND |
|---|---|---|---|
| 2 | GND | 120 | GND |
| 3 | SD7 | 121 | RESETDRV |
| 4 | SD6 | 122 | IOCHCK# |
| 5 | SD5 | 123 | IRQ9 |
| 6 | SD4 | 124 | DRQ2 |
| 7 | SD3 | 125 | WSO# |
| 8 | SD2 | 126 | SMEMW# |
| 9 | SD1 | 127 | SMEMR# |
| 10 | SD0 | 128 | IOW# |
| 11 | IOCHRDY | 129 | IOR# |
| 12 | AEN | 130 | DACK3# |
| 13 | SA19 | 131 | DRQ3 |
| 14 | SA18 | 132 | DACK1# |
| 15 | SA17 | 133 | DRQ1 |
| 16 | SA16 | 134 | REF# |
| 17 | SA15 | 135 | SCLK |
| 18 | SA14 | 136 | IRQ7 |
| 19 | SA13 | 137 | IRQ6 |
| 20 | SA12 | 138 | IRQ5 |
| 21 | SA11 | 139 | IRQ4 |
| 22 | SA10 | 140 | IRQ3 |
| 23 | SA9 | 141 | DACK2# |
| 24 | SA8 | 142 | TC |
| 25 | SA7 | 143 | BALE |
| 26 | SA6 | 144 | OSC |
| 27 | VCC | 145 | VCC |
| 28 | VCC | 146 | VCC |

FIG.7

| | | | |
|---|---|---|---|
| 29 | VCC (INTERNAL) | 147 | VCC (INTERNAL) |
| 30 | VCC (INTERNAL) | 148 | VCC (INTERNAL) |
| 31 | SA5 | 149 | MEMCS 16# |
| 32 | SA4 | 150 | IOCS 16# |
| 33 | SA3 | 151 | IRQ10 |
| 34 | SA2 | 152 | IRQ11 |
| 35 | SA1 | 153 | IRQ12 |
| 36 | SA0 | 154 | IRQ15 |
| 37 | SBHE# | 155 | IRQ14 |
| 38 | LA23 | 156 | DACK0# |
| 39 | LA22 | 157 | DRQ0 |
| 40 | LA21 | 158 | DACK5# |
| 41 | LA20 | 159 | DRQ5 |
| 42 | LA19 | 160 | DACK 6# |
| 43 | LA18 | 161 | DRQ6 |
| 44 | LA17 | 162 | DACK7# |
| 45 | MEMR# | 163 | DRQ7 |
| 46 | MEMW# | 164 | MASTER# |
| 47 | SD8 | 165 | SD12 |
| 48 | SD9 | 166 | SD13 |
| 49 | SD10 | 167 | SD14 |
| 50 | SD11 | 168 | SD15 |
| 51 | HDCS0# | 169 | HDCS1# |
| 52 | HDENL# | 170 | HDENH# |
| 53 | HD7 | 171 | HDIR |
| 54 | VBAK | 172 | BATWRN# |
| 55 | BATLOW# | 173 | POWERGOOD |
| 56 | SUSSTAT# | 174 | EXTSMI# |
| 57 | SRBTN# | 175 | RESERVE |
| 58 | SPKOUT | 176 | RESERVE |
| 59 | GND | 177 | GND |

FIG.8

| | | | |
|---|---|---|---|
| 60 | GND | 178 | GND |
| 61 | FPDOTCLK | 179 | FPAC |
| 62 | FPVTIM | 180 | FPHTIM |
| 63 | LD0 | 181 | LD1 |
| 64 | LD2 | 182 | LD3 |
| 65 | LD4 | 183 | LD5 |
| 66 | LD6 | 184 | LD7 |
| 67 | LD8 | 185 | FPBLANK |
| 68 | FPVCCON | 186 | FPVEEON |
| 69 | RESERVE | 187 | RESERVE |
| 70 | RESERVE | 188 | RESERVE |
| 71 | RESERVE | 189 | RESERVE |
| 72 | RESERVE | 190 | RESERVE |
| 73 | VSYNC | 191 | HSYNC |
| 74 | GREEN | 192 | GRTN |
| 75 | BLUE | 193 | BRTN |
| 76 | RED | 194 | RRTN |
| 77 | FLOART | 195 | PGM |
| 78 | ROMCEO# | 196 | RESERVE |
| 79 | ANIN0 | 197 | ANIN1 |
| 80 | ANIN2 | 198 | ANIN3 |
| 81 | RESERVE | 199 | RESERVE |
| 82 | VCC(INTERNAL) | 200 | VCC(INTERNAL) |
| 83 | VCC(INTERNAL) | 201 | VCC(INTERNAL) |

FIG.9

| 84 | VCC | 202 | VCC |
|---|---|---|---|
| 85 | VCC | 203 | VCC |
| 86 | COMBDTR# | 204 | COMBRI# |
| 87 | COMBCTS# | 205 | COMBRXD |
| 88 | COMBRTS# | 206 | COMBTXD |
| 89 | COMBDSR# | 207 | COMBDCD# |
| 90 | COMADTR# | 208 | COMARI# |
| 91 | COMACTS# | 209 | COMARXD |
| 92 | COMARTS# | 210 | COMATXD |
| 93 | COMADSR# | 211 | COMADCD# |
| 94 | LPTD7 | 212 | LPTD6 |
| 95 | LPTD5 | 213 | LPTD4 |
| 96 | LPTD3 | 214 | LPTD2 |
| 97 | LPTD1 | 215 | LPTD0 |
| 98 | LPTDIR | 216 | LPTSLTCIN# |
| 99 | LPTINIT# | 217 | LPTSLCT |
| 100 | LPTPE | 218 | LPTBUSY |
| 101 | LPTACK# | 219 | LPTERROR# |
| 102 | LPTAFD# | 220 | LPTSTROBE# |
| 103 | RESERVE | 221 | RESERVE |
| 104 | SMOUT0 | 222 | SMOUT1 |
| 105 | SMOUT2 | 223 | SMOUT3 |
| 106 | FDDS1# | 224 | FDDS2# |
| 107 | FDMT1# | 225 | FDMT2# |
| 108 | FDSTEP# | 226 | FDDIR |
| 109 | FDSIDE | 227 | FDRD# |
| 110 | FDWD# | 228 | FDWE# |
| 111 | FDWP# | 229 | FDDCHG# |
| 112 | FDINDEX# | 230 | FDTRK0# |
| 113 | FDHIDEN | 231 | RESERVE |
| 114 | RESERVE | 232 | RESERVE |
| 115 | KBCLK | 233 | KBDATA |
| 116 | MSCLK | 234 | MSDATA |
| 117 | GND | 235 | GND |
| 118 | GND | 236 | GND |

FIG.10 ature, and thus helps save the labor used in developing
ELECTRONIC DEVICE HAVING A FLAT, CARD-LIKE CASING ENCLOSING COMPONENTS FOR A COMPLETE COMPUTER SYSTEM INCLUDING A SUB-PRINTED WIRING BOARD ATTACHED TO AN INNER SURFACE OF THE CASING AND ELECTRICALLY CONNECTED TO A PRINTED WIRING BOARD BY A FLEXIBLE MEMBER This is a division of application Ser. No. 08/151,214 filed Nov. 12, 1993, now U.S. Pat. No. 5,481,432.

BACKGROUND OF THE INVENTION

1. Field of the Invention

The present invention relates to an electronic device, and more particularly, to an electronic device in which computer system component elements such as a CPU and peripheral equipment control ICs are encased in a card-like casing.

2. Description of Related Art

In recent years, microcomputer technology has made outstanding progress. Microcomputers have been substituted for hardware to perform control functions, and thus have come to be incorporated in a variety of equipment. The equipment having such built-in computers includes automobiles, vending machines, machine tools, cash dispensers, etc. The computer systems incorporated in these equipment are designed exclusively for the equipment (for special purposes). That is, they are special purpose computers. Their applicabilities to general purposes (that is, as general purpose computers) are low. This is because an optimal configuration and a minimum size differs depending on the purpose of the application. If a general purpose computer system is adopted, the equipment, including the computer system becomes large in size.

The foregoing computer system incorporated in equipment does not usually have generality in terms of a shape and a size. Nevertheless, some computer systems preserve generality in terms of architecture. This is attributable to the fact that a specific architecture (for example, PC-AT of IBM Corp.) has been regarded as a substantial standard in this industry. As long as the architecture is adopted, a variety of peripheral equipment conformable to the architecture is available. The peripheral equipment is not limited to external storage devices such as a hard disk and communication equipment but also includes a debugger and an in-circuit emulator (ICE) for use in development.

However, even when an architecture is generalized, as mentioned above, since a shape is not generalized, it takes considerable time for development and manufacturing. This point will be clarified. In a computer system incorporated in a type of equipment, a central processing unit (hereinafter, CPU) and peripheral equipment control ICs are mounted on one or more than two printed wiring boards and then connected over printed circuits. When an attempt is made to downsize the equipment, or when priority is given to the design of an outline, since a space in which a computer system is stowed is limited, the size and shape of a printed wiring board (hereinafter, PW board) cannot help being diversified. For developing new equipment, designing and manufacturing of a new computer system, that is, designing and manufacturing of a shape of a PW board, a layout or chips, and artwork of wiring must be carried out independently. If a computer system needs a plurality of printed wiring boards, the manner in which the printed wiring board is to be segmented and connected must be determined and signals to be transferred must be defined.

Thus, development of a new product is not a simple matter. Rapidly varying needs from markets sometimes cannot be accommodated. Assuming that development of a new product is not commenced until market needs are grasped, half a year or one year elapses before a developed product actually is put on the market. Consequently, the product becomes obsolete and then dies out before long. This arises a necessity of introducing new products one after another. The costs for developing new products and updating manufacturing facilities have become quite a burden.

SUMMARY OF THE INVENTION

Accordingly, the present invention attempts to solve the aforesaid problems and provide an electronic device that realizes a unit (package) computer system, which is to be incorporated in an equipment, having a specific shape and structure, and thus helps save the labor used in developing or designing a computer system for each different type of equipment.

To solve the aforesaid problems, the present invention provides an electronic device in which computer system component elements including a CPU are encased in a card-like casing. The first means of the present invention is an electronic device in which computer system component elements including a CPU, memories, and peripheral equipment control ICs are encased in a card-like casing. A connector, to which a control bus including at least a portion of address buses and data buses, over which the CPU alone can transmit information, and an IO bus, over which the peripheral equipment control ICs transfer signals to or from external peripheral equipment, are connected, is formed on one side of the casing.

In the foregoing fundamental configuration, one particular component is a PW board on which computer system component elements are mounted. The casing includes a frame made up of a framework for supporting the circumference of the PW board by enclosing three sides thereof with one side left free and a reinforcement bar laid on the one free side, and upper and lower covers each of which is fixed to the frame with the PW board between them. The connector is formed on the one free side of the frame. Preferably, the casing is made of conducting material and the upper and lower covers and the frame are conducting. In addition, it is preferred to include a conducting means, such as a pin or a screw, that attains the conduction between the ground lines on the PW board and the casing.

As for a structure of the connector, connection terminals are lined at least in a plurality of rows and ribs are formed to divide a row of connection terminals into two or more sections in the longitudinal direction of the connector. The connection terminals at both ends of the plurality of rows in the connector are preferably dedicated to ground lines. The connection terminals adjoining the ribs are preferably dedicated to ground lines or power lines. The control bus and IO bus are preferably located at positions among the connection terminals in the connector where they do not oppose each other. The control bus and IO bus are preferably separated from each other with the power lines or ground lines. The separating position is preferably not the center of the connector. The one free side on which the connector is formed is not limited to a short side of the casing but may be a long side thereof.

The second means of the present invention is an electronic device in which computer system component elements including a CPU, memories, and peripheral equipment control ICs are encased in a card-like casing. At least one of the system component elements is mounted on a PW board in the form that the element assumes before it is sealed within a package. The mounted system component element is then sealed with a resin. In the foregoing configuration, at least one of the system component elements is mounted on a sub-PW board that is independent of the foregoing PW board. Both the PW boards are electrically coupled using a flexible member. The sub-PW board is attached to the inner surface of the casing using an adhesive. The resin sealing for the system component element is carried out after the system component element is mounted on a sub-PW board having a structure that enables connection to an apparatus used for performing electrical forming on the system component element. The sub-PW board is directly attached to the PW board on which the other system component elements are mounted. The system component element to be sealed with a resin after being mounted on the sub-PW board may be a memory that stores procedures to be executed by the CPU.

The third means of the present invention is a computer comprising the aforesaid electronic device, a connector that can be joined with the electronic device, an input means that is electrically coupled via the connector and can input at least characters or position coordinates to the CPU in the electronic device, and peripheral equipment that is electrically coupled via the connector and operates according to the signals sent from the peripheral equipment control ICs in the electronic device.

In the first means, an electronic device has computer system component elements such as a CPU, memories, and peripheral equipment control ICs stowed in a card-like casing. A control bus and an IO bus are connected to a connector formed on one side of the casing. The whole electronic device is shaped like a card, which occupies a limited volume for storage and is so thin as to be mounted in various equipment. The electronic device need not be optimized in design for each type of equipment but can be mounted as it is, whereas desired functions (computer functions) can still be implemented. This lightens a burden of designing an equipment, and other burdens as well. Furthermore, since both the control bus and the IO bus are connected to a single connector, connection of signals with an equipment can be achieved merely by loading the electronic device. Line connections are thus simplified.

As for a structure, the electronic device includes a PW board on which computer system component elements are mounted. The casing comprises a frame made up of a framework for supporting the circumference of the PW board by enclosing three sides thereof with one side left free and a reinforcement bar laid on the free side, and upper and lower covers either of which is attached to the frame with the PW board between them. The connector may be formed on the free side of the frame. The frame is included to prevent the PW board from warping. Since the frame includes the reinforcement bar, if the free side is a long side, deformation of the connector itself can be suppressed. When the casing is made of a conducting material, if the upper and lower covers and the frame are conducting, the PW board, on which component elements are mounted, is surrounded with conducting materials. A chassis structure is thus constructed, which exerts an electrostatic shielding effect for the PW board on which component elements are mounted. Accordingly, propagation of noise due to electromagnetic radiation occurring in the printed wiring board can be prevented and influence of external noise can be shut out. In whatever equipment the electronic device is mounted, interference by noise can be minimized. In particular, when a conducting means for attaining the conduction between the ground lines on the PW board and the casing is installed, the casing will not be electrically floated with respect to the ground potential of the casing but will always be set to the ground potential. This perfects the electrostatic shielding that shields all four sides of the PW board, thus eliminating noise interference. Furthermore, the connector has connection terminals arranged at least in a plurality of rows, and has ribs attached to divide the rows of connection terminals into two or more sections in the longitudinal direction thereof. This structure not only provides a sufficient number of lines for linking the electronic device and equipment but also suppresses warp and other deformation of the connector. The structure exerts the effect of preventing incorrect insertion of the card-type electronic device. Furthermore, when the connection terminals at both ends of the plurality of rows in the connector are dedicated to ground lines, an electrostatic shielding effect can be applied to signals passing through the other connection terminals located inside. In the connector, when connection terminals are lined at least in a plurality of rows, if the control bus and IO bus are located at positions where they are not opposed to each other, a margin against noise will increase and signal connections will become simple. Furthermore, the control bus and IO bus are separated from each other using power or ground lines. If the separating position is not the center of the connector, occurrence of noise resulting from electromagnetic radiation can be minimized. Moreover, when the connector is formed on a long side of the casing, the number of terminals can be increased. This helps downsize the casing.

In the electronic device of the second means, computer system component elements such as a CPU, memories, peripheral equipment control ICs, and display ICs are stowed in a card-like casing. At least one of the system component elements is mounted on a PW board in the form assumed by the element before being sealed within a package, and then it is sealed within a resin. The thickness of the PW board on which the system component element is mounted can therefore be reduced drastically. At least one of the system component elements is mounted on a sub-PW board that is independent of the above PW board, and both the PW boards are electrically coupled using a flexible member. The sub-PW board is then attached to the inner surface of the casing using an adhesive. This structure is advantageous from the viewpoints of the flexibility of a system configuration and the downsizing of a device. The resin sealing for the system component element is carried out after the system component element is mounted on a sub-PW board having a structure that enables connection to an apparatus used to perform electrical forming on the system component element. The sub-PW board is then attached directly to the PW board on which the other system component elements are mounted. Using this mounting method, even a system component element that cannot undergo electrical forming until it is sealed with a resin can be mounted directly on a PW board. Moreover, the thickness of the whole electronic device can be reduced. The system component element that is to be sealed with a resin after being mounted on the sub-PW board may be a memory that stores procedures to be executed by the CPU.

The third means of the present invention is a computer, wherein an input means (for example, a pointing device such as a keyboard or a mouse), which is electrically coupled via a connector that can be joined with an electronic device, is used to input at least characters or position coordinates to the CPU in the electronic device. This information is processed by the CPU. The CPU produces signals for controlling peripheral equipment in cooperation with peripheral equipment control ICs. The peripheral equipment connected via the connector operates according to the signals sent from the peripheral equipment control ICs in the electronic device.

BRIEF DESCRIPTION OF THE DRAWINGS

The invention will be described in detail with reference to the following drawings in which like reference numerals refer to like elements, and wherein:

FIG. 7 is an explanatory diagram showing part of a pin configuration in a connector;

FIG. 8 is an explanatory diagram showing another part of the pin configuration in the connector;

FIG. 9 is an explanatory diagram showing another part of the pin configuration in the connector;

FIG. 10 is an explanatory diagram showing another part of the pin configuration in the connector;

DETAILED DESCRIPTION OF PREFERRED EMBODIMENTS

Figure 1:
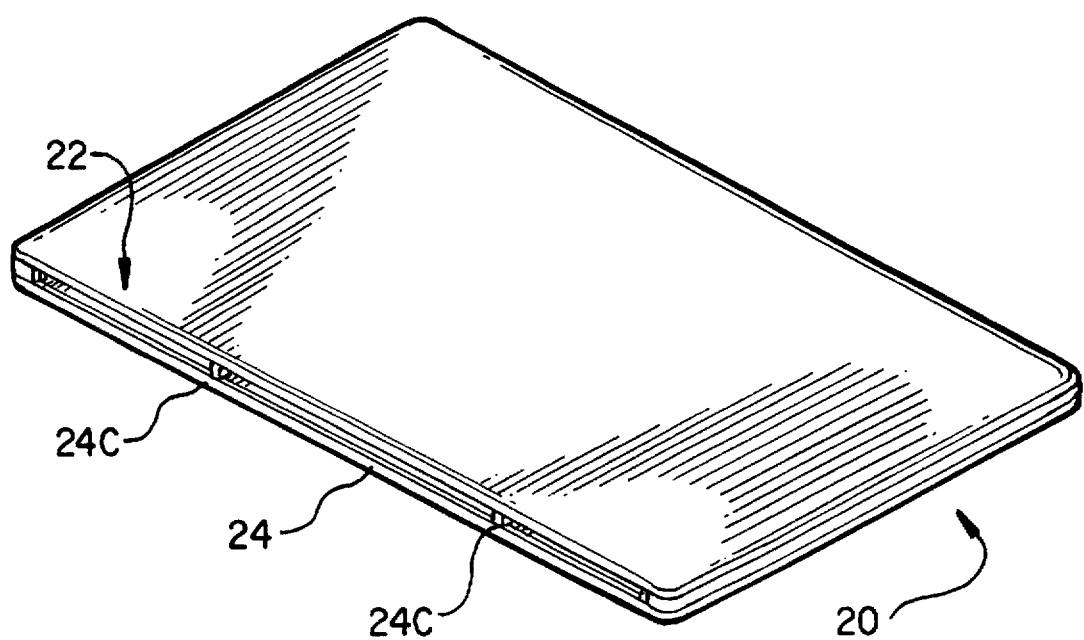
FIG. 1 is an oblique view showing the appearance of a card-type computer representing one embodiment of the present invention.
Figure 2:
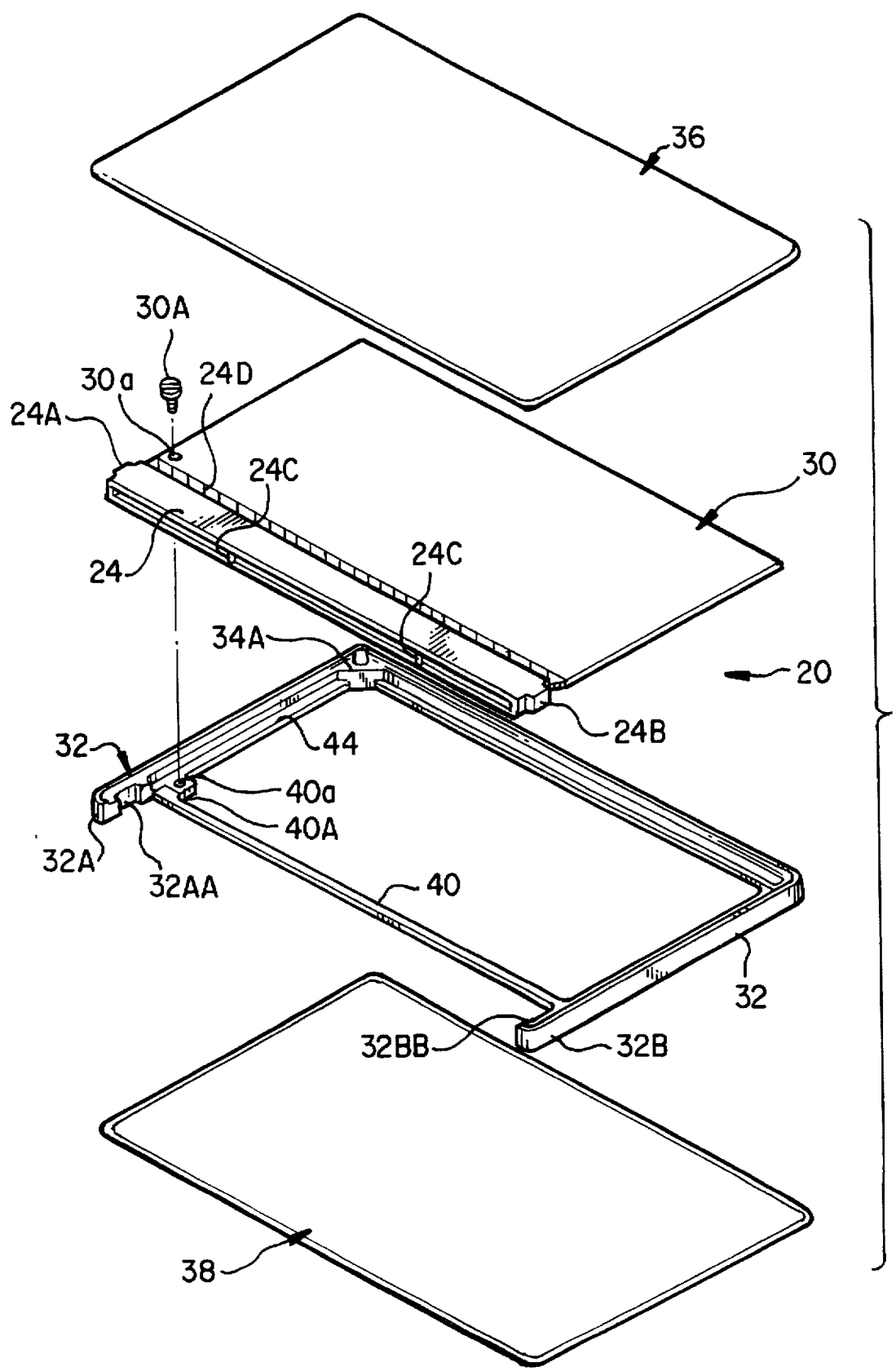
FIG. 2 is an exploded oblique view showing the structure of the FIG. 1 card-type computer.
Figure 3:
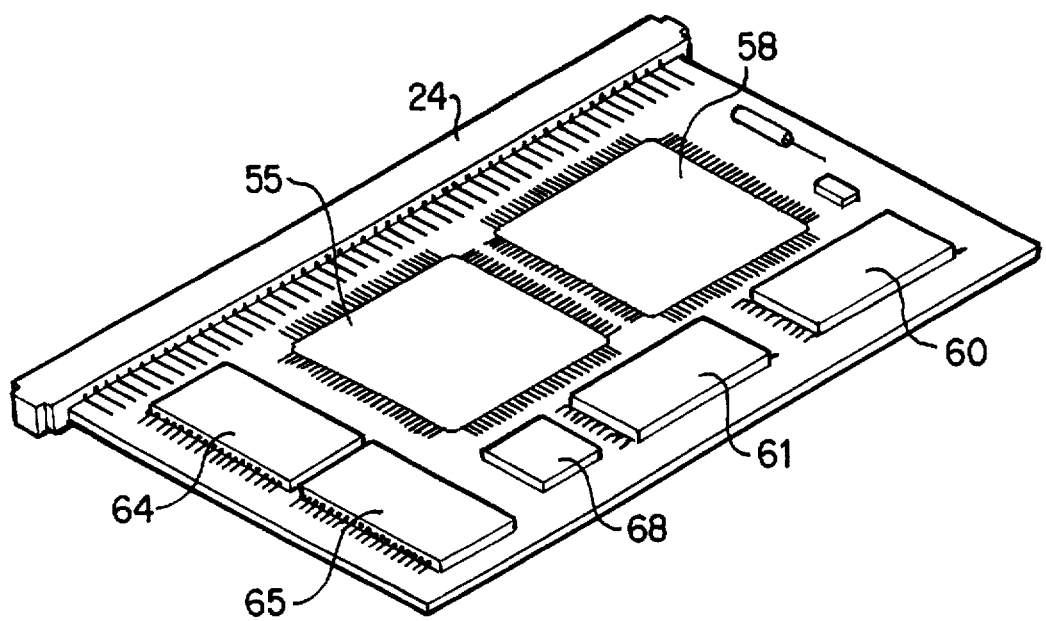
FIG. 3 is an oblique view showing the layout of chips on the front of a printed wiring board incorporated in the card-type computer.

In order to further clarify the aforesaid configuration and operation, a card-type computer and a small-sized computer including the card-type computer will be described as preferred embodiments of the present invention. FIG. 1 shows an appearance of a card-type computer representing the first embodiment of the present invention. FIG. 2 is an exploded oblique view showing assembling of a casing for the card-type computer. FIG. 3 is a block diagram showing an internal configuration of the card-type computer.

As illustrated, a card-type computer 20 of this embodiment is 54 mm wide, 85 mm long, and 3.3 mm thick and has the same shape as a so-called IC card or the like. The thickness is not limited to 3.3 mm but may be, for example, 3.8 mm or 5.5 mm. The thickness can be increased freely. A connector 24 having 236 pins in two rows is installed on one longitudinal side 22 of computer 20. The card-type computer 20 comprises a multi-ply printed wiring board (hereinafter, PW board) 30 having the connector 24 formed on one side thereof and having functional parts mounted thereon, a frame 32 in which the PW board 30 is stowed and that is made of a synthetic resin, and an upper cover 36 and a lower cover 38 that are locked in a stepped section formed on the outermost circumference of the frame 32, that constitute a casing, and that are made of a metal such as stainless steel.

The connector 24 has ribs 24C for warp prevention at two positions in the longitudinal direction thereof, and bosses 24A and 24B at both ends. A multi-ply PW board having six plies of wiring surfaces is adopted as the PW board 30 in this embodiment, which helps shrink the area of the PW board. A through-hole area 24D for attaining the conduction among the lines in the plies, which is shown as a hatched area in FIG. 2, is created along the long side 22 on the front and back of the PW board in order to distribute signal lines and power lines that are linked to the terminals on the front and back of the PW board 20. These terminals are joined with the pins arranged in two rows (upper and lower rows) in the connector, and are laid on the six plies of wiring surfaces.

The frame 32 is a framework shaped like a bracket and produced by die-casting aluminum, for example. A bar 40 extends over part of the frame 32 over the opening of the frame 32 in order to suppress deformation of the connector and upgrade the strength of the connector. At ends 32A and 32B of the frame 32 facing the opening, recesses 32AA and 32BB are formed so that the bosses 24A and 24B formed on both sides of the connector 24 and fixed to one long side of the PW board 30 will be fitted into the recesses 32AA and 32BB. A step 44 is formed on the inner circumference of the frame 32. When the bosses 23A and 23B on the connector 24 are fitted into the recesses 32AA and 32BB in the frame 32, the PW board 30 having the connector 24 is locked in the step 44 inside the frame 32. In this state, the upper and lower covers 36 and 38 are fixed to the frame 32. Thus, assembling the card-type computer 20 is completed. In this embodiment, a projection 40A that is formed as part of the frame 32 at a corner at which the bar 40 joins the step 44 and that has a screw hole 40a, and a screw hole 30a formed at a place corresponding to the screw hole 40a near a corner on the PW board 30 are provided to secure the PW board 30 to the frame 32. Specifically, a tightening screw 30A is fitted into the screw holes 40a and 30a. The screwing region is not limited to the corner at which the bar 40 joins the step 44 but also may be a corner 34A of the step 44, for example. The ground lines on the PW board 30 are electrically coupled with the frame 32 made by die-casting aluminum via the metallic tightening screw 30A. The metallic upper cover 36 and lower cover 38 shield the front and back of the PW board 30. The frame 32, upper cover 36, and lower cover 38 define an electrostatic shielding structure for the PW board 30, which prevents propagation of noise (due to electromagnetic radiation) occurring in the PW board 30 and eliminates the influence of external noise. The upper cover 36 and lower cover 38 are molded by means of press working so that they will or will not sink slightly as necessary. The upper cover 36 and lower cover 38 are fixed to the frame 32 using a double-sided adhesive tape or an adhesive. In one embodiment, the frame 32 may not be made by die-casting aluminum, but may be made by die-casting zinc or made of a metal such as stainless steel.

Figure 4:
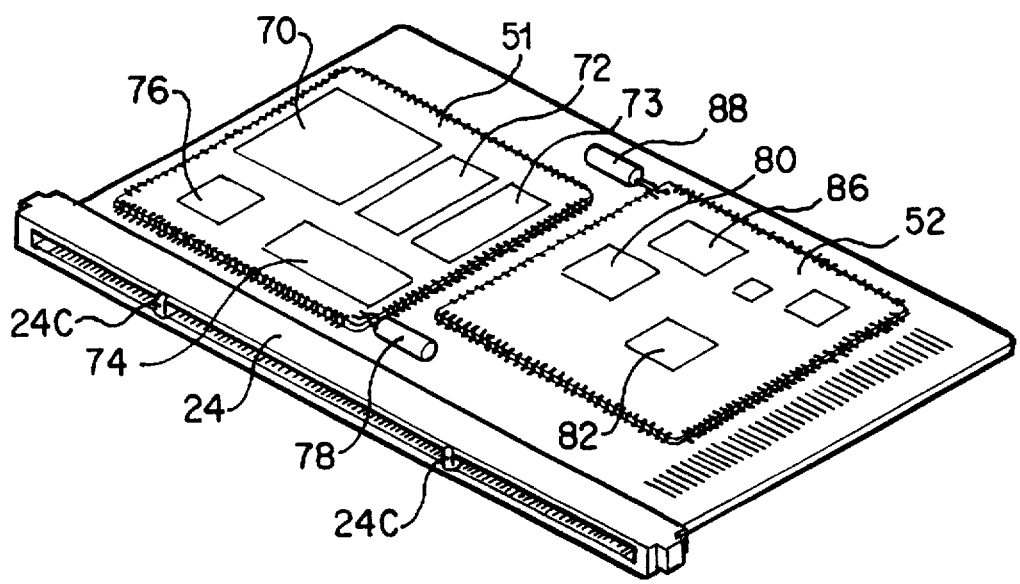
FIG. 4 is an oblique view showing the layout of chips on the back of the printed wiring board.
Figure 5:
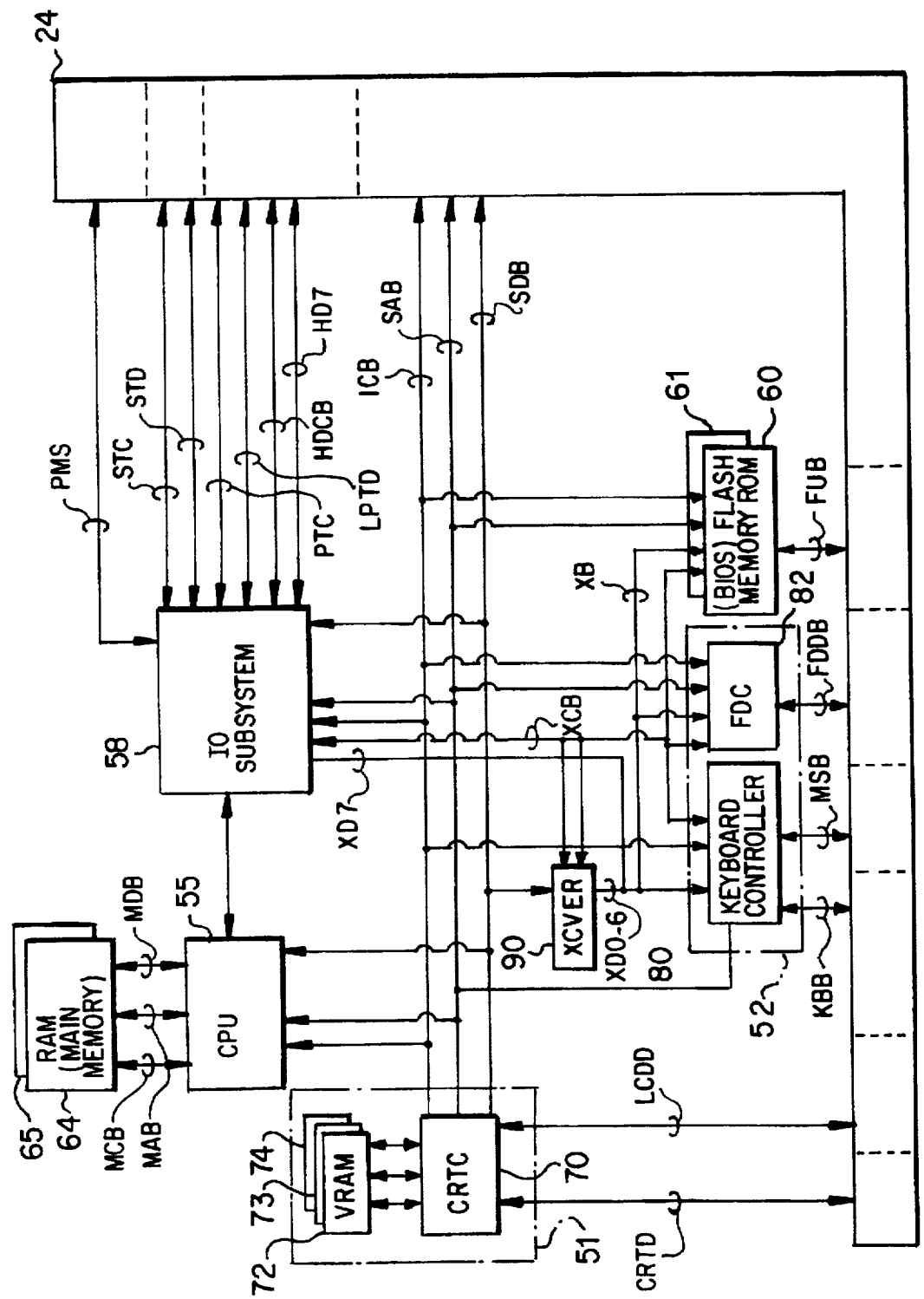
FIG. 5 is a block diagram showing the electrical circuitry of the card-type computer.

Referring to FIGS. 3 and 5, the internal configuration of the card-type computer 20 will be described. FIG. 3 is an oblique view showing a state in which component parts are mounted on the top of the PW board 30. FIG. 4 is an oblique view showing the back of the PW board 30. FIG. 5 is a block diagram showing the connections of component parts mounted on the PW board 30.

As illustrated, the PW board 30 is a double-sided PW board. Two sub-PW boards 51 and 52 are placed on the back of the PW board 30. On the front of the PW board 30, a CPU (model 386SL manufactured by Intel Corp.) 55 and an IO subsystem chip (model 82360SL manufactured by Intel Corp.) 58 for handling input- and output-related signals are mounted in the center thereof. Two ROMs 60 and 61, in which a basic input output system (BIOS) is written and which serve as flash memories, two RAMS 64 and 65 each having a capacity of 4 megabits and serving as a main memory, and a constant current control circuit 68 designed for an image control circuit (or CRTC) that will be described later are mounted around the CPU 55 and IO subsystem chip 58. In addition to these elements, simple logic circuits and oscillators are mounted. However, further mention will not be made of them.

The sub-PW board 51 mounted on the back of the PW board 30 is a PW board on which video-related circuits are installed. An image control circuit (model CL-GD6412 manufactured by Cirrus Logic, Inc.) 70 for controlling the display of 640 by 480 dots in size, RAMs 72, 73, and 74 for three video memories each having a capacity of one megabit, an oscillator (PLL) 76 designed for the image control circuit 70, and a quartz resonator 78 that is lying in a stepped area on the board and dedicated to the oscillator 76 are mounted on the sub-PW board 51.

The other sub-PW board 52 is a PW board on which other IO-related circuits are installed. A keyboard controller 80, a floppy disk controller (FDC) 82, an oscillator 86 dedicated to the floppy disk controller 82, a quartz resonator 88 that is lying in a stepped area on the board and dedicated to the oscillator 86, and a bus transceiver for driving a local bus are mounted on the sub-PW board 52.

The elements, sub-PW boards 51 and 52, and connector 24 are connected to one another as shown in FIG. 5. Specifically, the CPU 55 and the RAMs 64 and 65 are connected mutually over a memory address bus MAB, a memory data bus MDB, and a memory control bus MCB. The CPU 55, IO subsystem chip 58, sub-PW board 51, and connector 24 are connected to one another over a system address bus SAB that has the structure defined with a so-called ISA bus and has a capacity of 24 bits, a 16-bit system data bus SDB, and an ISA control bus ICB.

Among the above ISA buses, the system control bus SDB and ISA control bus ICB are connected to the sub-PW board 52 and flash-memory ROMs 60 and 61. The seven low-order bits XD0 to XD6 on the system data bus SDB are supplied to the sub-PW board 52 and ROMs 60 and 61 via a cross receiver (XCVER) 90. The bit XD7 thereon is directly output by the IO subsystem chip 58. Eight bits of XD0 to XD7 constitute bus data for a local bus XB. The cross receiver 90 drives the local bus XB in the direction of either inputting or outputting data to or from the system data bus SDB. A cross control bus XCB extending from the IO subsystem chip 58 is connected to the sub-PW board 52 and flash-memory ROMs 60 and 61. These elements are subject to the control of the IO subsystem chip 58.

Power management signals PMS for controlling a power supply system by operating external equipment of the card-type computer 20 are transferred between the IO subsystem chip 58 and connector 24. The IO subsystem chip 58 and connector 24 are connected to each other over a serial control bus STC designed for serial communication, a data bus STD designed for serial communication, a parallel control bus PTC for controlling input and output of a parallel signal, an 8-bit parallel data bus LPTD, and a hard disk control bus HDCB for controlling a hard disk. In addition, a data signal HD7 for controlling a hard disk is transferred between the IO subsystem chip 58 and connector 24.

The flash-memory ROMs 60 and 61 and the connector 24 are connected to each other over an update signal bus FUB for rewriting the contents of the flash-memory ROMs 60 and 61 externally. A floppy disk drive bus FDDB extends from the floppy disk controller 82 in the sub-PW board 52. A mouse control bus MSB and a keyboard bus KBB extend from the keyboard controller 80. A liquid crystal panel driving signal LCDD and a CRT driving signal CRTD are sent from the image control circuit 70 in the sub-PW board 51.

Among the aforesaid elements, the CPU 55, IO subsystem chip 58, image control circuit 70, oscillators 76 and 86, keyboard controller 80, and floppy disk controller 82 are formed with chips that are not sealed with sealing plastic or ceramic packages and that are referred to as bare chips. They can be mounted by means of TAB or wire bonding. TAB-based mounting will be described as a mounting method for the CPU 55 or IO subsystem chip 58 using the CPU 55 as an example.

Figure 6A:
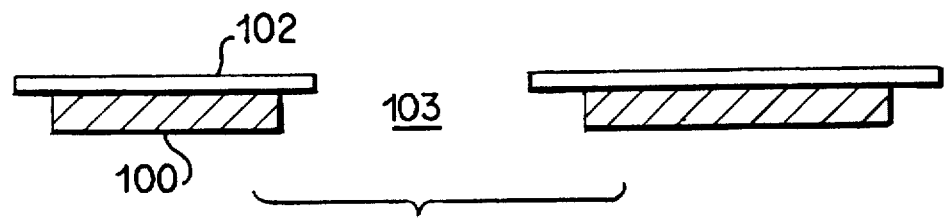
FIGS. 6A–6C are explanatory diagrams showing one example of a bare chip mounting method.
Figure 6B:
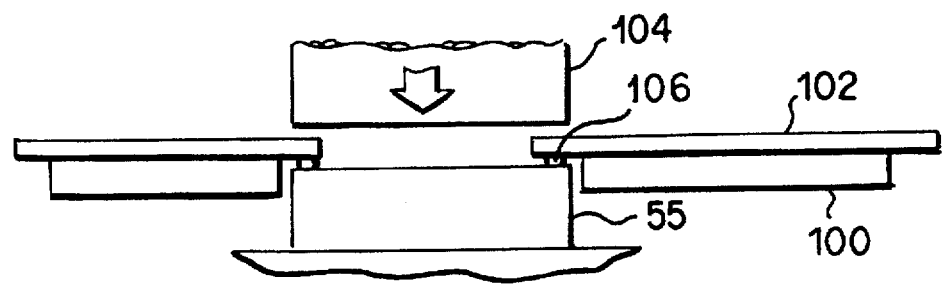
Figure 6C:
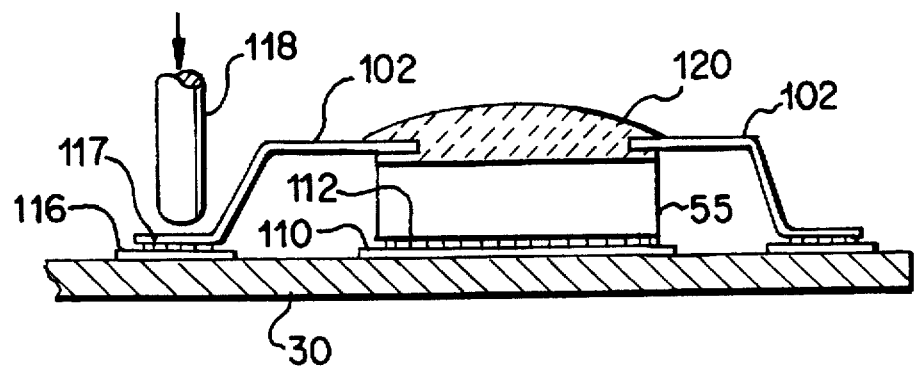

FIGS. 6A–6C show the processes of TAB-based mounting for mounting the CPU 55. First, a synthetic resin tape 100 on which wiring patterns 102 are formed by foiling copper is prepared. The surface of the copper-foiled wiring patterns 102 are then tinned. The tape 100 has an opening 103 at a position at which the CPU 55 is mounted. One end of the wiring patterns 102 are projecting into the opening 103. The tape 100 is placed on the CPU 55, which is a bare chip, so that the opening 103 will coincide with the CPU 55. More precisely, the tape 100 is placed so that a gold bump 106, which is formed on the top of the CPU 55 and provides connections, will be located at the ends of the wiring patterns 102.

In the above state, as shown in FIG. 6B, the wiring patterns 102 are pressed from above using a heated rod 104. This causes the bump 106 to fuse, whereby the connections to the ends of the wiring patterns 102 are perfected. Next, the wiring patterns 102 are, as shown in FIG. 6C, subjected to electrical forming. The tape 100 is removed, and then the wiring patterns 102 are positioned at a mounting area on the PW board 30. Solid patterns (die pads) 110 joined with the ground lines are located at a position on the PW board 30 at which the CPU 55 is mounted. The CPU 55 and solid patterns 110 are electrically and thermally coupled with one another with silver paste 112 between them.

The other ends of the wiring patterns 102, which have been subjected to electrical forming, are aligned with lands 116 on the PW board 30. Solder 117 placed on the lands is fused to the wiring patterns 102 using a hot bar 118. The other ends of the wiring patterns 102 are thus joined with the lands 116. Thereafter, a resin 120 is molded on the CPU 55. As shown in FIG. 6C, the resin 120 partially seals the CPU 55. Mounting the CPU 55 is thus completed. The bare chips of, for example, the image control circuit 70 and keyboard controller 80 except the CPU 55 and IO subsystem chip 58 are hard to mount on both sides of the PW board 30 as they are. The bare chips are therefore mounted on the sub-PW boards 51 and 52, and then the sub-PW boards 51 and 52 are soldered to the PW board 30.

The mounting processes for the entire PW board 30 are summarized below.

(1) Printing is performed by applying creamy solder to required places on substrate conductor patterns.

(2) The CPU 55 and IO subsystem chip 58 are soldered by means of TAB as detailed above.

(3) Component parts (for example, a flash-memory ROM 60), which are to be mounted on the surface of the PW board 30 on which the CPU 55 is mounted, are soldered by means of reflow soldering.

(4) The sub-PW boards 50,51 are soldered to the back of the PW board 30.

(5) The connector 24 is soldered to the PW board 30.

The order of the processes (1) and (2) may be reversed. If TAB soldering is performed first, the soldered state will improve. If reflow soldering for the component parts to be mounted on the front of the PW board 30 is performed first, fusing of solder used in TAB soldering need not be a concern. The processes are therefore carried out smoothly.

In this embodiment, the bare chips on the sub-PW board 51 and 52; such as, the image control circuit 70 and keyboard controller 80, are connected to substrate conductor patterns by performing wire bonding. The mounting processes including the wire bonding process for the sub-boards 51 and 52 are summarized below.

(1) Thermo-setting is performed by attaching bare chips to the sub-PW boards 51 and 52 using conductive paste (die attaching process).

(2) Wire bonding is performed by joining the pads on the bare chips and the lands on the sub-PW boards 51 and 52 using gold wires.

(3) Thermo-setting is performed by molding the bare chips using an epoxy resin.

(4) Parts (for example, a video-memory RAM 72) to be mounted on the front of the PW board are soldered by means of reflow soldering.

The actual manufacturing steps are interrupted with tests and burn-in. Herein, descriptions of the testing processes are omitted.

The PW board 30, which has been manufactured through the above mounting processes, is stowed in the frame 32 The upper cover 36 and lower cover 38 are then fixed to the frame 32. The card-type computer 20 is thus completed. The thickness of the card-type computer 20 of this embodiment is as thin as less than 3.3 mm owing to the aforesaid methods of TAB and wire bonding that enable mounting of bare chips. What is referred to as an ISA architecture is adopted as the computer architecture. The card-type computer 20 alone enables connections of a keyboard, a mouse, a floppy disk unit, a hard disk, a CRT, and a liquid crystal display panel.

The connector 24 of the card-type computer 20 is formed on one side 22 of the card-type computer 20 in the longitudinal direction thereof. Every electrical coupling can be achieved merely by connecting elements to the connector 24. The pin configuration of the connector 24 will be described below. FIGS. 7 to 10 are explanatory diagrams showing the pin configuration of the connector 24. As illustrated, the connector 24 has two rows of pins, each containing 118 pins. The connector (and pins) is divided into four sections by the types of signals using power lines Vcc and ground lines GND to separate each section. Physically, the connector 24 in divided into three sections with two reinforcement ribs 24C. As shown in FIG. 7, pins 1 and 2, and 119 and 120 in upper and lower rows at one end of the connector 24 are linked to ground lines GND. As shown in FIG. 10, pins 117 and 118, and 235 and 236 in upper and lower rows at the other end of the connector 24 also are linked to ground lines GND. These pins provide electrostatic shields to isolate the other signal lines. The reason why two pins in each of upper and lower rows are used for ground lines GND is to minimize the resistances (impedances) occurring in the ground lines. The first physical pin zone ranges from one end of the connector 24 to one of the reinforcement ribs 24C, and includes pins 1 to 28 and 119 to 146. The pins 27 and 28, and 145 and 146 are linked to 5 V power lines Vcc. The reason why two pins in each of upper and lower rows are used for the power lines Vcc is to minimize the impedances occurring in the power lines. The second physical pin zone lies between two reinforcement ribs 24C, and includes pins 29 to 83 and 147 to 201. The pins 29 and 30, and 147 and 148 are linked to 3 V power lines Vcc (internal). The pins 82 and 83, and 200 and 201 also are linked to 3 V power lines Vcc (internal). The third physical pin zone ranges from the other reinforcement rib 24C to the other end of the connector 24, and includes pins 84 to 118 and 202 to 236. The pins 84 and 85, and 202 and 203 are linked to 5 V power lines Vcc.

The pins 1 to 50, and 119 to 168 are assigned signals to be placed on the so-called ISA buses. The signals will be described below.

System Address signals SA19 to SA0: these signals represent 20 bits constituting information to be placed on the system address bus SAB, and are assigned to the pins 13 to 26, and 31 to 36. The signals represent addresses in a memory or an I/O device connected over the bus. The addresses are latched and held for a bus cycle, and then become valid.

Latchable Address signals LA23 to LA17: these signals represent seven bits constituting information to be placed on the system address bus SAB, and are assigned to the pins 38 to 44. The signals represent addresses in a memory device connected over the bus. The signals are used together with the system address signals, thus enabling access to a memory space of 16 megabytes long connected over the bus. These signals are not latched.

System Byte High Enable SBHE#: this is one of the signals to be placed on the system control bus SCB, and is assigned to the pin 37. When SBHE# is active, eight high-order bits (SD15 to 8) on the system data bus are transferred.

System Data signals SA15 to 0: these signals constitute data to be placed on the system data bus SDB, and are assigned to the pins 3 to 10, 47 to 50, and 165 to 168. The 16-bit data bus is used to transfer data between a memory or an I/O device and a CPU, which are connected over the bus.

I/O Read signal IOR#: this is one of the signals to be placed on the ISA control bus ICB, and is assigned to the pin 129. The signal enables an I/O device to place data on the bus.

I/O Write signal IOW#: this is one of the signals to be placed on the ISA control bus ICB, and is assigned to the pin 128. The signal enables an I/O device to fetch data from the bus.

I/O Chip Select signal IOCS16#: this is one of the signals to be placed on the ISA control bus ICB, and is assigned to the pin 150. When this input is low, the system becomes aware that 16-bit I/O transfer is adopted as data transfer over the bus. 16-bit I/O transfer is a default, during which one wait state is inserted. On the other hand, when the input is not driven low, data transfer is carried out bit by bit. For the bit-by-bit transfer, 8-bit data is transferred for an I/O cycle during which four wait states are inserted.

Memory Read signal MEMR#: this is one of the signals to be placed on the ISA control bus ICB, and is assigned to the pin 45. The signal enables a memory device to place data on the bus.

Memory Write signal MEMW#: this is one of the signals to be placed on the ISA control bus ICB, and is assigned to the pin 46. The signal instructs a memory device to fetch data from the bus.

System Memory Write signal SMEMW#: this is one of the signals to be placed on the ISA control bus ICB, and is assigned to the pin 126. When a memory space of 0 to 1 megabytes connected over the bus is placed in a memory read cycle, this signal becomes active.

Memory Chip Select signal MEMCS16#: this is one of the signals to be placed on the ISA control bus ICB, and is assigned to the pin 149. The signal informs the system of 16-bit memory transfer. When this signal is not active, the default of a memory bus cycle is a 4 wait-state 8-bit cycle.

Address Enable signal AEN: this is one of the signals to be placed on the ISA control bus ICB, and is assigned to the pin 12. When AEN is high, a DMA cycle is adopted.

DMA Requests DRQ7 to 5, and DRQ3 to 0: these requests are part of signals to be placed on the ISA control bus ICB, and are assigned to the pins 163, 161, 159, 157, 131, 124, and 133. The request signals request for DMA data transfer.

DMA Acknowledge signals DACK7 to 5, and DACK3 to 0#: these are part of signals to be placed on the ISA control bus ICB, and are assigned to the pins 162, 160, 158, 130, 141, 132, and 156. The signals indicate that control of the bus is passed to a DMA channel.

Terminal Count signal TC: this is one of the signals to be placed on the ISA control bus ICB, and is assigned to the pin 142. When DMA-based data transfer comes to the last cycle, this signal becomes active.

Refresh signal REF#: this is one of the signals to be placed on the ISA control bus ICB, and is assigned to the pin 134. When the signal is active, a bus refresh cycle is requested or in progress.

Master signal MASTER#: this is one of the signals to be placed on the ISA control bus ICB, and is assigned to the pin 164. The signal becomes active when an external bus master attempts to gain a control authority for the bus. Before activating the signal, the external bus master activates DMA Request DRQn#, which indicates a DMA transfer channel to be employed, and receives DMA Acknowledge DACKn#.

System clock signal SCLK: this is one of the signals to be placed on the ISA control bus ICB, and is assigned to the pin 135. In this embodiment, SCLK is a basic clock for the bus that has a frequency of 8 MHz and a duty ratio of 50%.

Oscillator signal OSC: this is one of the signals to be placed on the ISA control bus ICB, and is assigned to the pin 144. In this embodiment, OSC is a clock signal having a frequency of 14.31818 MHz and a duty ratio of 50%. This signal is asynchronous with the system clock.

I/O Channel Check signal IOCHCK#: this is one of the signals to be placed on the ISA control bus ICB, and is assigned to the pin 122. When a parity error or unrecoverable error occurs in a memory or an I/O device connected over the bus, the signal informs the system of this fact. This signal provides a non-maskable interrupt NMI for the system.

I/O Channel Ready signal IOCHRDY: this is one the signals to be placed on the ISA control bus ICB, and is assigned to the pin 11. IOCHRDY operates to terminate a bus cycle during which the bus is used. When a memory or an I/O device currently using the bus attempts to extend a bus cycle, if this signal is driven low immediately after a valid address and command are detected, the cycle can be extended. Until this signal is driven high, the system continues to insert a wait state to an ongoing cycle.

Zero Wait State signal WSO#: this is one of the signals to be placed on the ISA control bus ICB, and is assigned to the pin 125. When the bus is used for a 16-bit bus cycle, one wait state is inserted by default. When a bus cycle should terminate without a wait state, this signal becomes active.

Reset Drive signal RESETDRV: this is one of the signals to be placed on the ISA control bus ICB, and is assigned to the pin 121. When the power supply is turned on, this signal is held active for a specified period of time for system initialization.

Buffered Address Enable signal DALE: this is one of the signals to be placed on the ISA control bus ICB, and is assigned to the pin 143. The system address signals SA19 to 0 on the address bus are internally latched with this signal. The signal is used when a device connected over the bus attempts to latch Latch Enable Address signals LA23 to 17.

Interrupt Enable signals IRQ15, 14, 12 to 9, and 7 to 3: these are part of signals to be placed on the ISA control bus ICB, and are assigned to the pins 154, 155, 153 to 151, 123, and 136 to 140. The signals are interrupt requests issued by external equipment to the system.

Next, the signals assigned to pin 51 to 58, and 169 to 176 will be described. These pins in the connector 24 are assigned signals that are to be placed on so-called IDE buses and that are related to hard disk interface and power management.

Hard Disk Chip Select 0 signal HDCS0#: this is one of the signals to be placed on the hard disk control bus HCB, and is assigned to the pin 51. Two hard disks can be connected to the card-type computer 20. This signal specifies addresses 1F0H to 1F7F in an area to which the hard disks are allocated.

Hard Disk Chip Select 1 signal HDCS1#: this is one of the signals to be placed on the hard disk control bus HCB, and is assigned to the pin 169. Two hard disks can be connected to the card-type computer 20. This signal specifies addresses 3F0H to 3F7F in an area to which the hard disks are allocated.

Hard Disk Buffer Enable High signal HDENH#: this is one of the signals to be placed on the hard disk control bus HCB, and is assigned to the pin 170. When a hard disk is accessed in units of 16 bits, this signal is active.

Hard Disk Buffer Enable Low signal HDENL#: this is one of the signals to be placed on the hard disk control bus HCB, and is assigned to the pin 52. The signal is active for every cycle during which a hard disk is accessed.

Hard Disk Bit HD7: this signal represents a bit 7 of data related to hard disk interface on the data bus, and is assigned to the pin 53. This line alone is controlled inside the system.

Hard Disk Bus Data Direction signal HDIR: this is one of the signals to be placed an the hard disk control bus HCB, and is assigned to the pin 171. The signal is an output signal for controlling the in or out direction for the data buffer in a hard disk.

Battery Low signal BATLOW#: this is one of the signals to be placed on the hard disk control bus HCB, and is assigned to the pin 55. The signal reports to the system that the power in the battery has run out.

Battery Warning signal BATWRN#: this is one of the signals related to power management, and is assigned to the pin 172. The signal warns the system that the power in the battery is running out.

Suspend Status signal SUSSTAT#: this is one of the signals related to power management, and is assigned to the pin 56. The signal indicates that the system suspends.

Suspend Resume Button signal SRBTN#: this is one of the signals related to power management, and is assigned to the pin 57. This input is a signal for requesting the system to suspend or resume.

External System Management Interrupt signal EXTSMI#: this is one of the signals related to power management, and is assigned to the pin 174. The signal is an input signal representing a system management interrupt sent from an external device.

Power Good signal POWERGOOD: this is one of the signals related to power management, and is assigned to the pin 173. The signal indicates that the supply voltage has reached a specified value.

Speaker Out signal SPKOUT: this is a digital output signal for controlling the on or off operation of a loudspeaker connected externally and for generating a peep sound and is assigned to the pin 58.

Among the signals related to power management, the System Management Out signals SMOUT3 to 1 instruct external equipment connected to the card-type computer 20 to stand by, and thus control external equipment directly. I/O-related signal lines are therefore also linked to the connector 24. The pin numbers linked to the I/O-related signal lines will be described later.

Next, signals to be placed on the I/O bus and their assignment to the connector 24 will be described. The I/O bus is used mainly to transmit signals except those to be placed on the system bus over which the CPU 55 alone can transmit information, and those related to a hard disk.

Display signals LD8 to 0: these signals represent 9 bits in display data for a flat panel, and are assigned to the pins 63 to 67 and 181 to 184 in the connector 24.

Flat Panel Vertical Display Timing signal FPVTIM: this is one of the control signals for use in displaying data an a flat panel, and is assigned to the pin 62. The signal corresponds to a vertical synchronizing signal for attaining vertical synchronization in display.

Flat Panel Horizontal Display Timing signal FPHTIM: this is one of the control signals for use in displaying data on a flat panel, and is assigned to the pin 180. The signal corresponds to a horizontal synchronizing signal for attaining horizontal synchronization in display.

Flat Panel Data Shift clock signal FPDOTCLK: this is one of the control signals for use in displaying data on a flat panel, and is assigned to the pin 61. The clock signal shifts display data.

Flat Panel Power supply control signal FPVCCON: this is one of the power supply control signals to be output to a liquid crystal panel, and assigned to the pin 68. The liquid crystal panel usually adopts a dual-power supply system. The power supply control signal FPVCCON and a power supply signal FPVEEON that will be described next are used to control a first power supply $V_{CC}$ and a second power supply $V_{EE}$, which are required for the liquid crystal panel, according to a specific power on/off sequence.

Flat Panel Power Control signal FPVEEON: this is one of the power supply control signals to be output to a liquid crystal panel, and is assigned to the pin 186. The power supply control signal FPVEEON becomes active after the power supply control signal FPVCCON does, and becomes inactive before the power supply control signal FPVCCON does.

Liquid Crystal AC signal FPAC: this is a signal for producing ac voltage as voltage to be applied to liquid crystals in a liquid crystal panel. This signal is assigned to the pin 179. It is undesirable to apply dc voltage to liquid crystals. The dc voltage is therefore converted into ac voltage. This signal may be supplied by the liquid crystal panel but is often supplied by the system so that the liquid crystal panel will match a controller. In this embodiment, the card-type computer 20 supplies this signal.

Flat Panel Display Timing signal FPBLANK: this is one of the signals for controlling a liquid crystal panel, and is assigned to the pin 185. The signal instructs a period during which the liquid crystal panel should or should not display information. This signal is needed when a TFT color liquid crystal panel is connected.

Vertical Display Timing signal VSYNC: this is one of the control signals for controlling a CRT, and is assigned to the pin 73. The signal is a vertical synchronizing signal for CRT display.

Horizontal Display Timing signal HSYNC: this is one of the control signals for controlling a CRT, and is assigned to the pin 191. The signal is a horizontal synchronizing signal for CRT display.

Red signal RED: this is a red signal among R, G, and B signals for a CRT, and is assigned to the pin 76. This signal is a red one of color signals.

R Return signal RRTN: this is a return signal for the Red signal RED, and is assigned to the pin 194 that is opposed to the pin assigned the Red signal RED.

Green signal GREEN: this is a green signal among R, G, and B signals for a CRT, and is assigned to the pin 74. This signal is a green one of color signals.

G Return signal GRTN: this is a return signal for the Green signal GREEN. This signal is assigned to the pin 192 that is opposed to the pin assigned the Green signal GREEN.

Blue signal BLUE: this is a blue signal among R, G, and B signals for a CRT, and is assigned to the pin 75. This signal is a blue one of color signals.

B Return signal BRTN: this is a return signal for the Blue signal BLUE. This signal is assigned to the pin 193 that is opposed to the pin assigned the Blue signal BLUE.

Drive Select 1 signal FDDS1#: this is one of the signals to be fed to a floppy disk unit, and is assigned to the pin 106 The signal selects a disk drive 1.

Drive Select 2 signal FDDS2#: this is one of the signals to be fed to a floppy disk unit, and is assigned to the pin 224. The signal selects a disk drive 2.

Motor On 1 signal FDMT1#: this is one of the signals to be fed to a floppy disk unit, and is assigned to the pin 107. The signal is a motor on signal for the disk drive 1.

Motor On 2 signal FDMT2#: this is one of the signals to be output to a floppy disk unit, and is assigned to the pin 225. The signal is a motor on signal for the disk drive 2.

Step signal FDSTEP#: this is one of the signals to be fed to a floppy disk unit, and is assigned to the pin 108. The signal is a pulse signal for specifying the number of steps by which the disk head is to be advanced.

Direction signal FDDIR: this is one of the signals to be fed to a floppy disk unit, and is assigned to the pin 226. The signal specifies the direction of seeking. When the signal is driven low, the direction toward the inner circumference of a disk is designated. When the signal is driven high, the direction toward the outer circumference thereof is designated.

Side signal FDSIDE: this is one of the signals to be fed to a floppy disk unit and is assigned to the pin 109. This is a select signal for selecting either the head 0 or 1. When the signal is driven low, the head 1 is selected. When the signal is driven high, the head 0 is selected.

Read Data signal FDRD#: this is one of the signals to be supplied by a floppy disk unit, and is assigned to the pin 227. This is an input signal for inputting data read from a disk.

Write Data signal FDWD#: this is one of the signals to be fed to a floppy disk unit, and is assigned to the pin 110. This is an output signal for outputting data read from a disk.

Write enable signal FDWE#: this is one of the signals to be fed to a floppy disk unit, and is assigned to the pin 228. This signal instructs disk writing.

Write Protect signal FDWP#: this is one of the signals to be supplied by a floppy disk unit, and is assigned to the pin 111. The signal indicates that a floppy disk or a medium loaded in a disk drive is in the write protect state.

Disk Change signal FDDCHG#: this is one of the signals to be supplied by a floppy disk unit, and is assigned to the pin 229. The signal indicates that a disk loaded in a disk drive has been replaced with another one.

Index signal FDINDEX#: this is one of the signals to be supplied by a floppy disk unit, and is assigned to the pin 112. The signal indicates that a disk drive has detected an index hole.

Track 0 signal FDTRK0#: this is one of the signals to be supplied by a floppy disk unit, and is assigned to the pin 230. The signal indicates that a head is located at a cylinder 0.

High Density Select signal FDHIDEN: this is one of the signals to be fed to a floppy disk unit, and is assigned to the pin 113. The signal indicates that a disk is written at a high level in a high density mode.

Keyboard clock signal KBCLK: this is one of the signals to be fed to a keyboard, and is assigned to the pin 115. This is a clock signal for actuating a keyboard.

Keyboard Data signal KBDATA: this is one of the signals to be supplied by a keyboard, and is assigned to the pin 233. When a keyboard is operated, this signal represents serial data corresponding to a key code.

Mouse Clock signal MSCLK: this is one of the signals to be fed to a mouse, and is assigned to the pin 116. This is a clock signal for actuating a mouse.

Mouse Data signal MSDATA: this is one of the signals to be supplied by a mouse, and is assigned to the pin 234. The signal sent from a mouse represents data of magnitudes of movement of the mouse along the X and Y axes. In other words, this signal represents serial data including the data indicating a direction and a header.

Line Printer Strobe signal LPSTROBE#: this is one of the signals that are fed to peripheral devices including a printer to or from which parallel data are transferred, and is assigned to the pin 220. The signal serves as a data fetch signal for a peripheral parallel device. In the high-speed parallel port mode, this signal is used to indicate a write cycle.

Line Printer Auto Feed signal LPTAFD#: this is one of the signals that are fed to peripheral devices including a printer to or from which parallel data are transferred, and is assigned to the pin 102. When this signal is active, a parallel printer feeds a line for each line. In the highspeed parallel mode, the signal is used as a data strobe. During a write cycle, the signal is used as a data latch signal. During a read cycle, the signal is used as a buffer enable signal.

Line Printer Busy signal LPTUSY#: this is one of the signals that are supplied by peripheral devices including a printer to or from which parallel data are transferred, and is assigned to the pin 218. The signal indicates that the printer enters a state in which the printer cannot receive data from the system.

Line Printer Acknowledge signal LPTACK#: this is one of the signals that are supplied by peripheral devices including a printer to or from which parallel data are transferred, and is assigned to the pin 101. The signal indicates that data transfer has terminated and preparations should be made for the next transfer.

Line Printer Error signal LPTERROR#: this is one of the signals that are supplied by peripheral devices including a printer to or from which parallel data are transferred, and is assigned the pin 219. The signal reports an error state in a peripheral device.

Line Printer Paper End signal LPTPE: this is one of the signals that are supplied by peripheral devices including a printer to or from which parallel data are transferred, and is assigned to the pin 100. The signal reports that the printer has run out of paper.

Line Printer Initialize signal LPTINIT#: this is one of the signals that are fed to peripheral devices including a printer to or from which parallel data are transferred, and is assigned to the pin 99. The signal is used to initialize a peripheral equipment.

Line Printer Select In signal LPTSLCTIN#: this is one of the signals that are fed to peripheral devices including a printer to or from which parallel data are transferred, and is assigned to the pin 216. The signal is used to select a peripheral device currently connected to a port. In the high-speed parallel port mode, the signal is used as an address strobe.

Line Printer Selected signal LPTSLCT: this is one of the signals that are supplied by peripheral devices including a printer to or from which parallel data are transferred, and is assigned to the pin 217. This is a signal returned from a selected peripheral device so that it can be verified that the peripheral device has been selected.

Line Printer Direction signal LPTDIR: this is one of the signals that are fed to peripheral devices including a printer to or from which parallel data are transferred, and is assigned to the pin 98. The signal is used to control the in or out direction for an external buffer.

Line Printer Data signals LPTD7 to 0: these signals represent eight bits constituting data to be placed on the parallel data bus LPTD, and are assigned to the pins 94 to 97 and 212 to 215. These signals are unidirectional in the ISA mode, while bidirectional in the PS/2 mode.

Data Carrier Detect signals COMADCD# and COMBDCD#: these signals are fed to a serial interface having two channels A and B. The signal to be fed through the channel A is assigned to the pin 211, while the signal to be fed through the channel B is assigned to the pin 207. These signals indicate that a modem is electrically coupled.

Data Terminal Ready signals COMADTR# and COMBDTR#: these signals are fed to a serial interface having two channels A and B. The signal to be fed through the channel A is assigned to the pin 90, while the one to be fed through the channel B is assigned to the pin 86. These signals indicate that the system is ready to communicate.

Data Set Ready signal COMADSR# and COMBDSR#: these signals are fed to a serial interface having two channels A and B. The signal to be fed through the channel A is assigned to the pin 93, while the one to be fed through the channel B is assigned to the pin 89. These signals indicate that the power supply of a modem is turned on.

Request-to-Send signals COMARTS# and COMBRTS#: these signals are fed to a serial interface having two channels A and B. The signal to be fed through the channel A is assigned to the pin 92, while the one to be fed through the channel B is assigned to the pin 88. These signals suspend or restart transmission of data from a modem.

Clear-to-Send signals COMACTS# and COMBCTS#: these signals are fed to a serial interface having two channels A and B. The signal to be fed through the channel A is assigned to the pin 91, while the one to be fed through the channel B is assigned to the pin 87. These signals suspend or restart transmission of data from the system.

Ring indicator signals COMARI# and COMBRI#: these signals are fed to a serial interface having two channels A and B. The signal to be fed through the channel A is assigned to the pin 208, while the one to be fed through the channel B is assigned to the pin 204. These signals indicate that dialing is under way to establish a connection over a line.

Serial Data Transmit signals COMATXD and COMBTXD: these signals are fed to a serial interface having two channels A and B. The signal to be fed through the channel A is assigned to the pin 210, while the one to be fed through the channel B is assigned to the pin 206. These signals represent serial data to be fed to a modem.

Serial Data Receive signals COMARXD and COMBRXD: these signals are fed to a serial interface having two channels A and B. The signal to be fed through the channel A is assigned to the pin 209, while the one to be fed through the channel B is assigned to the pin 205. These signals represent serial data to be supplied by the modem.

Analog Input Terminal signals ANIN3 to 0: these analog signals are supplied to the system via four channels. These signals are assigned to the pins 79, 80, 197, and 198.

ROM Update signal FLOART: this signal is used to rewrite the contents of a flash-memory ROM, and is assigned to the pin 77. The signal changes operation modes of the system. When the signal becomes active, the flash-memory ROMs 60 and 61 can be rewritten.

ROM Write Power PGM: this is a special power line provided for rewriting a flash-memory ROM. This line is linked to the pin 195.

ROM Update signal ROMCEO#: this signal is used to rewrite the contents of a flash-memory ROM, and is assigned to the pin 78. This is a select signal for selecting either the flash-memory ROM 60 or 61.

System Management Out signals SMOUT: these signals instruct external equipment connected to the card-type computer 20 to stand by and thus control the external equipment directly. These signals are assigned to the pin numbers 104, 105, 222, and 223.

The signals assigned to the pins in the connector 24 have been described briefly. Among the pins shown in FIGS. 7 to 10, those written RESERVE are unused and reserved as spare pins. The pins written $V_{CC}$ are linked to the +5 V power lines. The pins written $V_{CC}$ (INTERNAL) are linked to the +3.3 V power lines designed for some components such as the RAMs 64 and 65. The pins written GND are linked to the ground lines.

Figure 11:
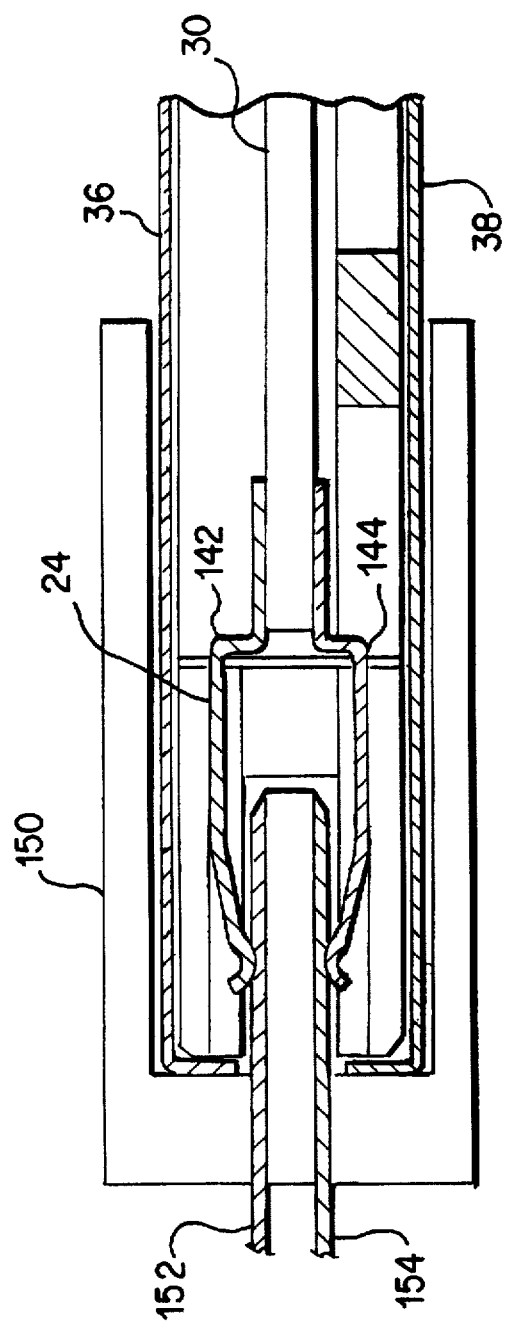
FIG. 11 is a sectional view showing the structure of the connector.

The connector 24 has pins arranged at intervals of a 0.635 mm pitch, for example. As shown in FIG. 11, the connection terminals 142 and 144 are soldered to the back and front of the PW board 30. The terminals come into contact with the contacts 152 and 154 in the connector body 150, thus completing connection.

Figure 12:
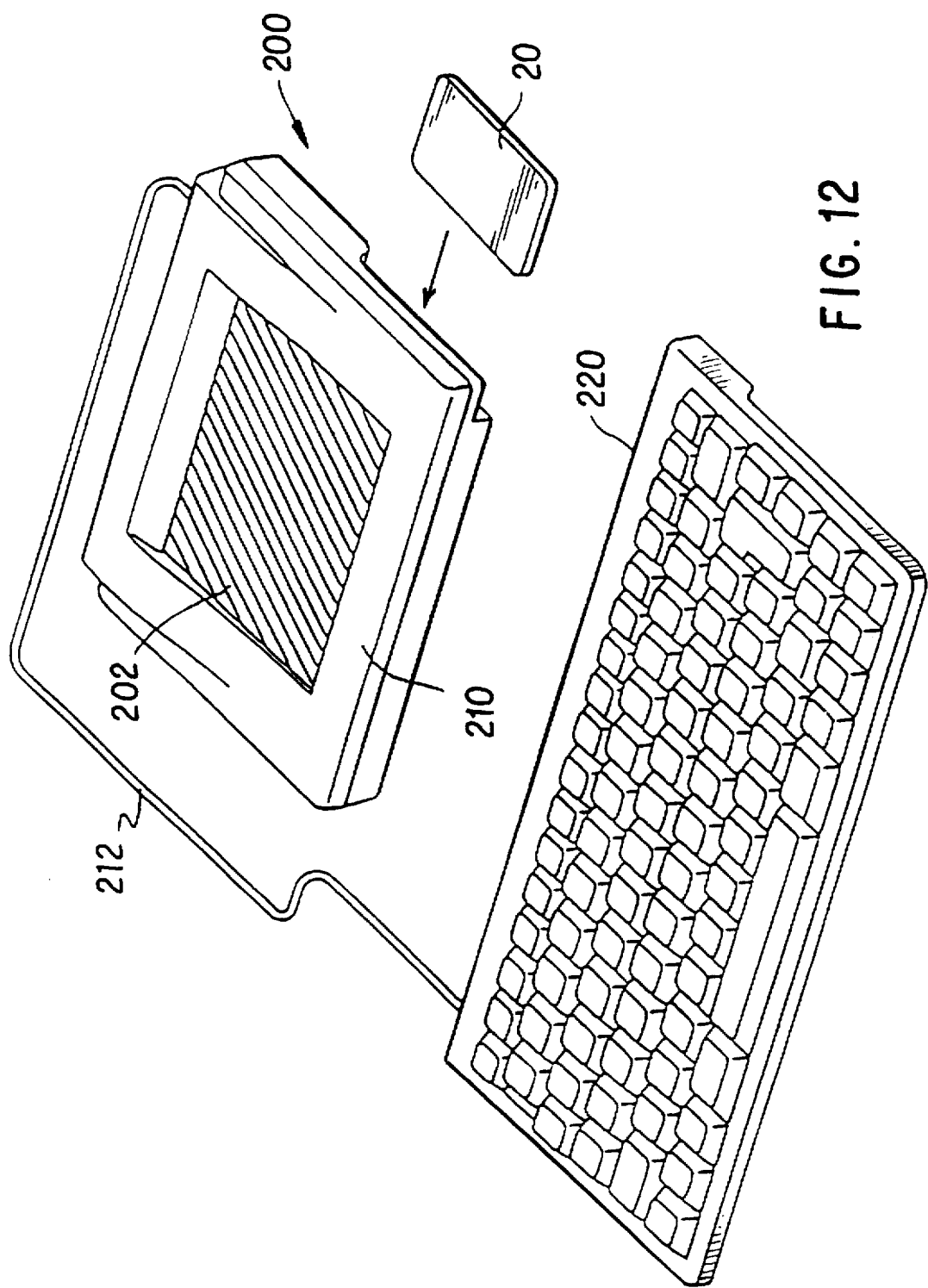
FIG. 12 is an oblique view showing the appearance of a small-sized computer using the card-type computer.

Next, a configuration of a small-sized computer 200 having the card-type computer 20 will be described. FIG. 12 is an oblique view showing the appearance of the small-sized computer 200. As illustrated, the small-sized computer 200 comprises a main unit 210 equipped with a liquid crystal panel 202 having a display zone of 640 by 480 dots in size, the card-type computer 20 of this embodiment to be loaded in the main unit, and a keyboard 220 connected to the main unit 210 over a cable 212.

Figure 13:
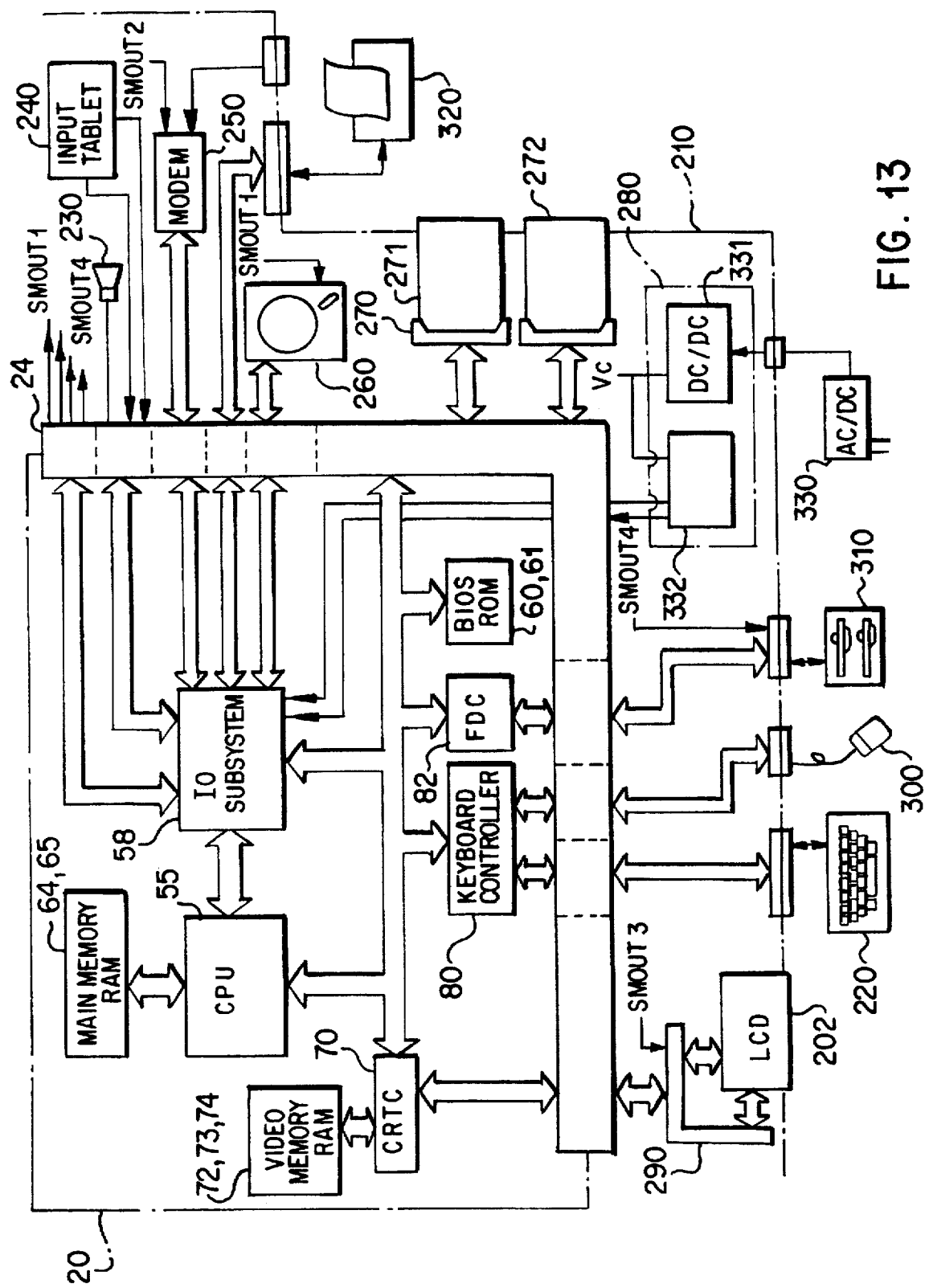
FIG. 13 is a block diagram showing the configuration of the small-sized computer.

FIG. 13 shows the internal configuration of the main unit 210 and the connections with peripheral equipment. As illustrated, a loudspeaker 230 connected to the connector 24 of the card-type computer 20, a pressure-sensitive pen-type input tablet 240 placed on the top of the liquid crystal panel 202, a modem 250 for use in communications, a hard disk 260 serving as an external storage device, IC memory cards 271 and 272 to be mounted in two IC card slots 270, a power circuit 280, and an LCD driver 290 for driving the liquid crystal panel 202 are incorporated in the main unit 210.

The liquid crystal panel 202 is an STN-type transparent panel 7" wide. A light emission plate underlies the liquid crystal panel 202. Two cold-cathode type light sources, which are to be turned on by an inverter, are installed at both sides of the light emission plate. The light sources illuminate the liquid crystal panel 202.

The main unit 210 is connected not only to the keyboard 220 but also to a mouse 300, a floppy disk unit 310, and a line printer 320 via various connectors. An AC adapter 330 for producing stabilized dc power using mains ac is connected over the power circuit 280. The power circuit 280 includes a DC/DC converter 331 and a card-type computer power control circuit 332. The DC/DC converter 331 receives dc power from the AC adapter 330 and produces a supply voltage Vc required by the main unit 210. The card-type computer power control circuit 332 receives dc power Vc and controls the supply voltage for the card-type computer 20. The card-type computer power control circuit 332 also receives power management signals from the IO subsystem chip 58 and controls various power supplies.

The System Management Out signals SMOUT1 to 4, which are sent from the card-type computer 20 via the connector 24, are fed to the modem 250, hard disk 260, and LCD driver 290 in the main unit 210, as well as the floppy disk unit 310 via a floppy disk connector. The System Management Out signals SMOUT1 to 4 are output when the IO subsystem chip 58 monitors the use states of equipment concerned and determines that the equipment concerned have not been used for a certain period of time. In response to the signals SMOUT1 to 4, the equipment selects a standby mode and saves on power consumption.

The card-type computer 20 of this embodiment has been described in conjunction with the configuration of the small-sized computer 200 including the card-type computer 20. In the card-type computer 20, all the basic components of the ISA architecture are incorporated in a casing of a so-called card size. The hard disk 260, modem 250, keyboard 220, mouse 300, floppy disk unit 310, and so on can therefore be connected directly via the connector 24. The card-type computer 20 by itself plays a pivotal role in a control unit or the like. Since the card-type computer 20 is shaped and sized like a card, it need not be optimized in design according to a control unit in which the card-type computer is to be incorporated. In short, the card-type computer 20 can be used as a general-purpose component. This results in the drastically reduced labor and lead time required for design and development of equipment using the card-type computer 20.

Because of the card-like appearance, design of the card-type computer 20 can proceed with an image of a conventional IC card borne in mind. Since the card-type computer 20 has the same size as the conventional IC card, a casing in which the card-type computer 20 is stowed can therefore be designed readily.

In addition to the card-like appearance, the card-type computer 20 has such a feature that the connector 24 is formed along a long side thereof. As many connection terminals as 236 pins are stowed in one connector 24. This eliminates the nuisance of using a plurality of connectors for connection with external equipment. Furthermore, pins that are assigned signals to be placed on the system bus of the CPU 55 and pins that are assigned I/O-related signals are separated from each other in the connector 24. In particular, both types of signals are not assigned to opposed connection pin. The system bus will therefore be unaffected by the influence of noise deriving from connected equipment. Power lines and ground lines are linked in the middle of the pins in the connector 24. The electrical length of the opening of the casing for the card-type computer 20 is therefore smaller than the overall length of the connector 24, thus making it easy to cope with noise due to electromagnetic radiation occurring in the card-type computer 20 (EMI measure). For further exploiting this merit, the upper cover 36 and lower cover 38, which constitute a casing, should be electrically coupled with the ground lines laid in the middle of the connector 24.

Furthermore, in the card-type computer 20 of this embodiment, a position at which the connector 24 is electrically split by the power and ground lines is off the center of the connector 24. The lengths of the electrical divisions of the opening will therefore not agree with each other, which eliminates a phenomenon of intensifying electromagnetic radiation noise occurring when the lengths of the electrical divisions of the opening agrees with each other.

According to the present embodiment, a very small-sized computer 200 can be manufactured effortlessly. Since the computer functions are integrated in the card-type computer 20, when the card-type computer 20 is changed to another one, the computer functions can be renewed. This simplifies upgrading a computer or changing the architecture of a computer to another architecture. Since a power management facility is incorporated in the card-type computer 20, the card-type computer 20 can be operated efficiently with a battery or the like in a small-sized computer.

Figure 14:
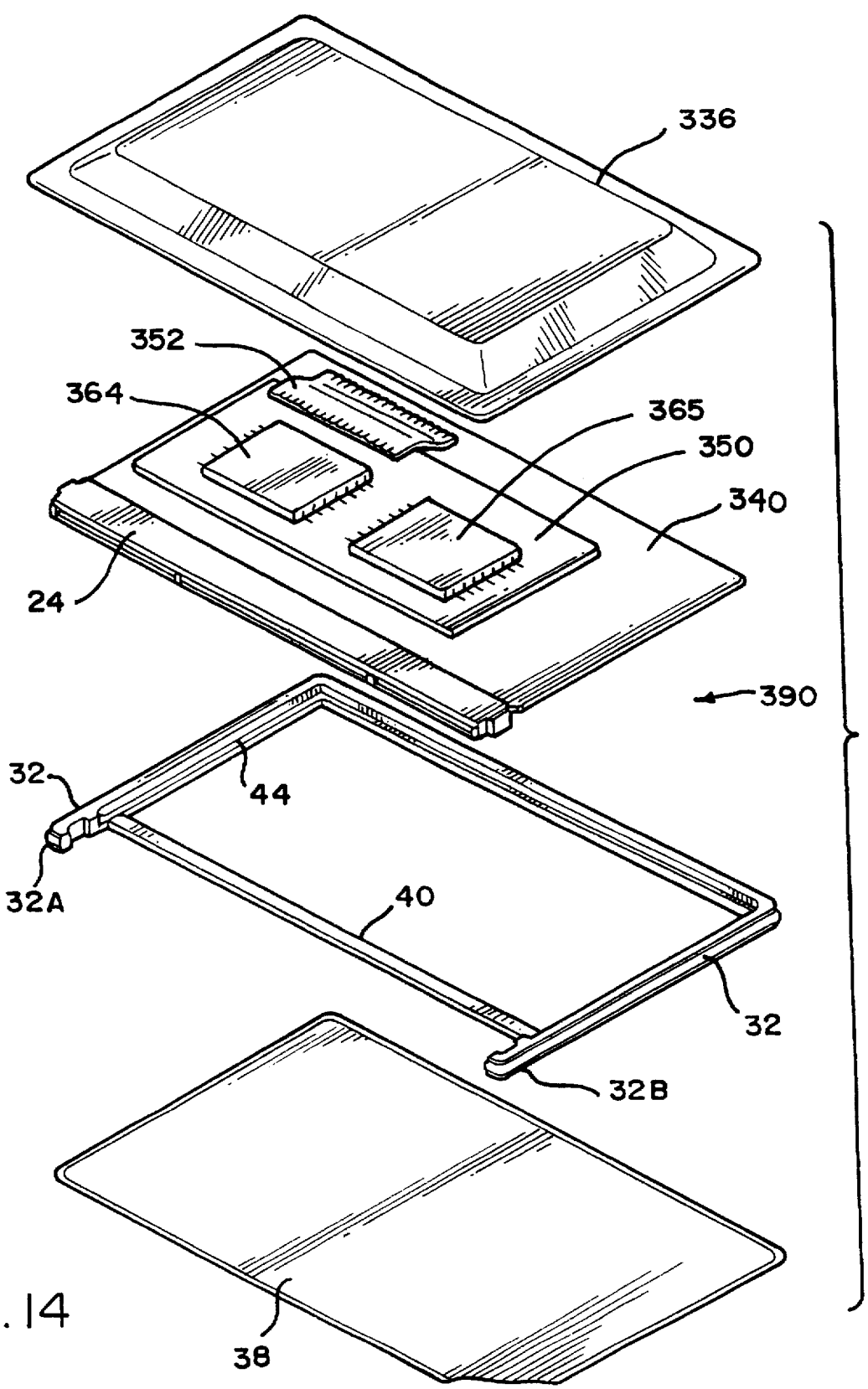
FIG. 14 is an exploded oblique view showing a structure of an electronic device representing a second embodiment of the present invention.
Figure 15:
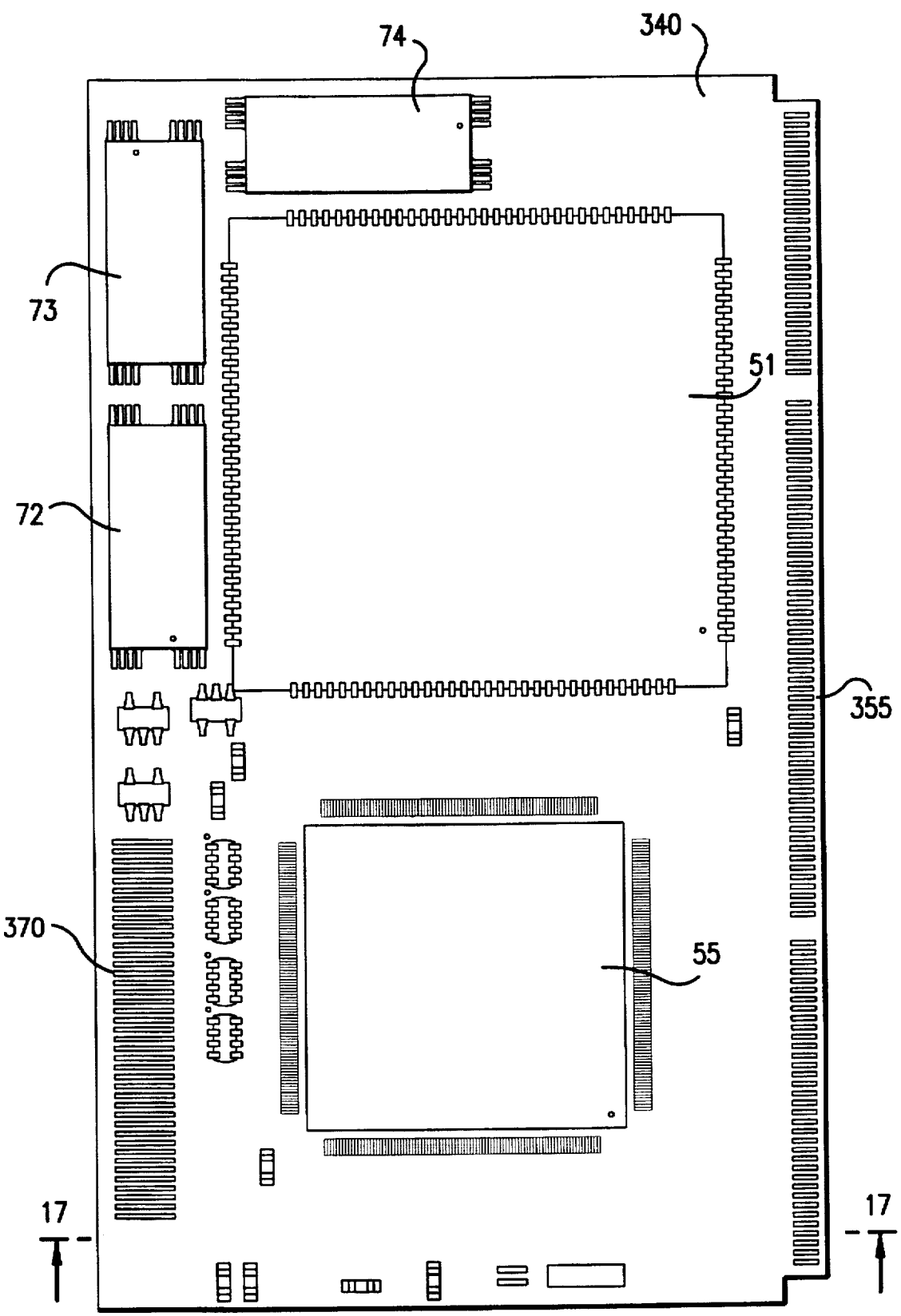
FIG. 15 is a plan view showing a layout of chips on the front of a main PW board in the second embodiment.
Figure 16:
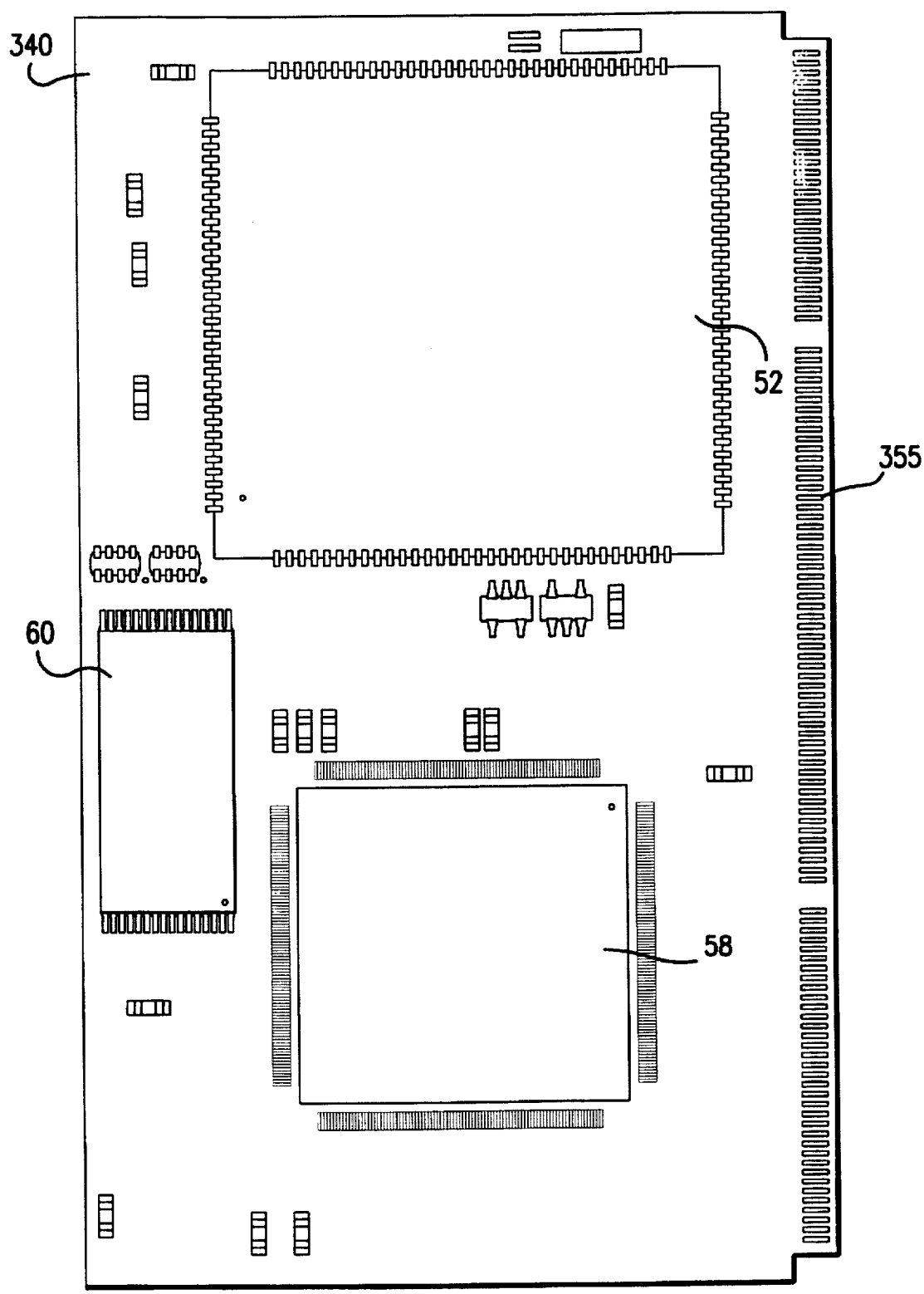
FIG. 16 is a plan view showing a layout of chips on the back of the FIG. 15 main PW board.

Next, the second embodiment of the present invention will be described. A card-type computer 390 of the second embodiment has substantially the same configuration as the card-type computer 20 of the first embodiment. As shown in FIG. 14, the mounting form of RAMs and the shape of an upper cover are different from those in the first embodiment. RAMs are mounted on a RAM board 350 or a sub-PW board instead of a main PW board 340 containing the CPU 55. Along with this modification, the layout of chips on the main PW board 340 are changed. The layout of chips on a PW board is shown in FIGS. 15 and 16. FIG. 15 is a plan view of the main PW board 340 an which the CPU 55 and other components are mounted. In FIG. 16, the main PW board 340 is seen through. Chips and the sub-PW board 52 are mounted at the mounting positions shown in FIGS. 15 and 16. In FIGS. 15 and 16, the connector 24 is not attached to the connection terminals 355 formed along one longitudinal edge of the main PW board 340. Component parts identical to those in the first embodiment bear the same reference numerals, of which description will be omitted.

In the card-type computer 390 of the second embodiment, as illustrated, RAMs 364 and 365 are placed on the RAM board 350 and the RAM board 350 is joined with the main PW board 340 via a flexible cable 352. Unlike the first embodiment, the video memory RAMs 72, 73, and 74 are not placed on the sub-PW board 52 but are directly mounted on the main PW board 340. As shown in FIG. 15, similar to the first embodiment, connection terminals 370, onto which the flexible cable 352 is soldered, are formed by the side of the CPU 55, which is a bare chip mounted on a printed-wiring board using the TAB method. The flexible cable 352 is soldered to the connection terminals 370. The other end of the flexible cable 352 is soldered to the connection terminals formed on the RAM board 350.

Figure 17:
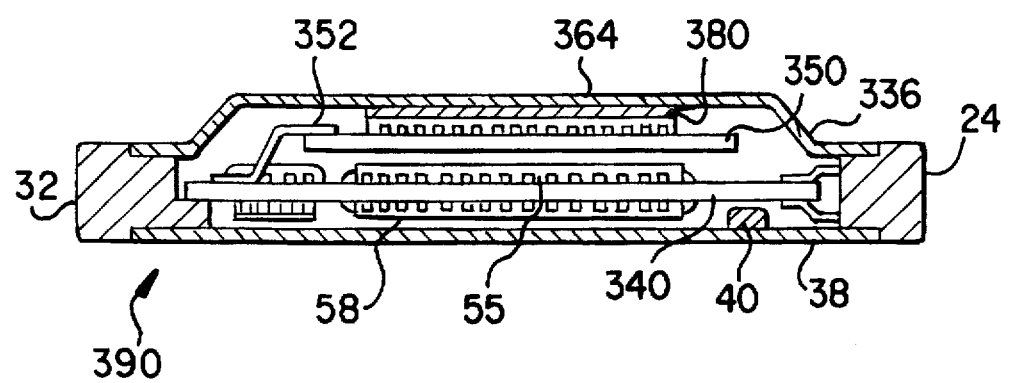
FIG. 17 is a sectional view showing the structure of the electronic device of the second embodiment.

In the foregoing structure, the RAM board 350 lies in the second story, while the main PW board 340 lies in the first story. An upper cover 336 is, unlike the one in the first embodiment, bulging outward by several millimeters. FIG. 17 is a cross-sectional view along line 17—17 of FIG. 15, showing the structure of the assembled card-type computer 390. As shown in FIG. 17, the RAM board 350 is attached to the back of the upper cover 336 using an adhesive or a double-sided adhesive tape 380. As a result, the RAM board 350 is slightly separated from the main PW board 340. Nevertheless, the thickness of the card-type computer 390 is less than 5 mm and satisfies the standard of Type 2, Version 2 (card thickness of 5 mm) stipulated by the PC Memory Card International Standardization Committee (PCMCIA).

The electrical circuitry of the card-type computer 390 having the aforesaid structure is identical to that of the first embodiment. The card-type computer 390 provides the same advantage as the card-type computer of the first embodiment. Furthermore, since the RAMs 364 and 365 are mounted on the RAM board 350 that is independent of the main PW board 340, the capacities of main memories can be increased readily. When the RAM board 350 is modified for a DRAM chip having a capacity of 16 or 64 megabits, although the main PW board 340 remains unchanged, the capacities of the main memories become four or sixteen times larger. In the card-type computer 390, the thickness of the connector portion remains small. The card-type computer 390 can therefore be joined with the connector for the card-type computer 20 of the first embodiment without any change.

Figure 18:
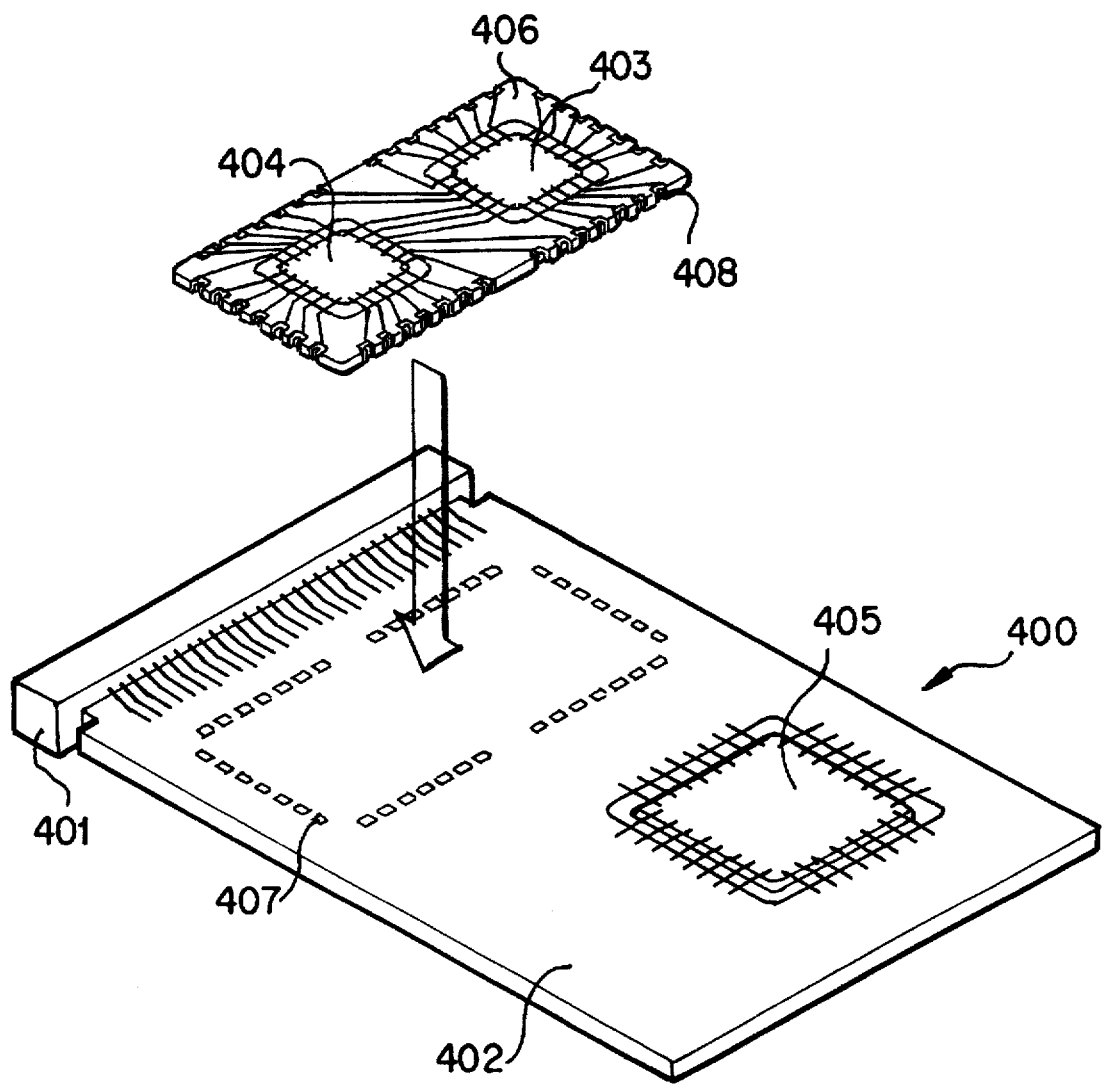
FIG. 18 is an oblique view showing the configuration of an electronic device representing a variant of the present invention.

Next, additional variants of the present invention will be described. FIG. 18 is an oblique view showing an embodiment of an electronic device 400 in which a BIOS is implemented in ERPROMs 403 and 404 instead of the flash-memory ROMs 60 and 61 in the first embodiment, and the EEPROMs 403 and 404 are mounted on a sub-PW board 406. The EEPROMs 403 and 404 must not be written data until they are sealed with a resin, which is a characteristic of an EEPROM.

In this embodiment, an external connection signal connector 401 provided for connections with external equipment is attached to one short side of a main PW board 402.

As for a CPU 405, similarly to that in the first embodiment, a bare chip is mounted on the main PW board 402 using the TAB method. Pads 407 are formed on the main PW board 402, on which a sub-PW board 406 is mounted.

Figure 19:
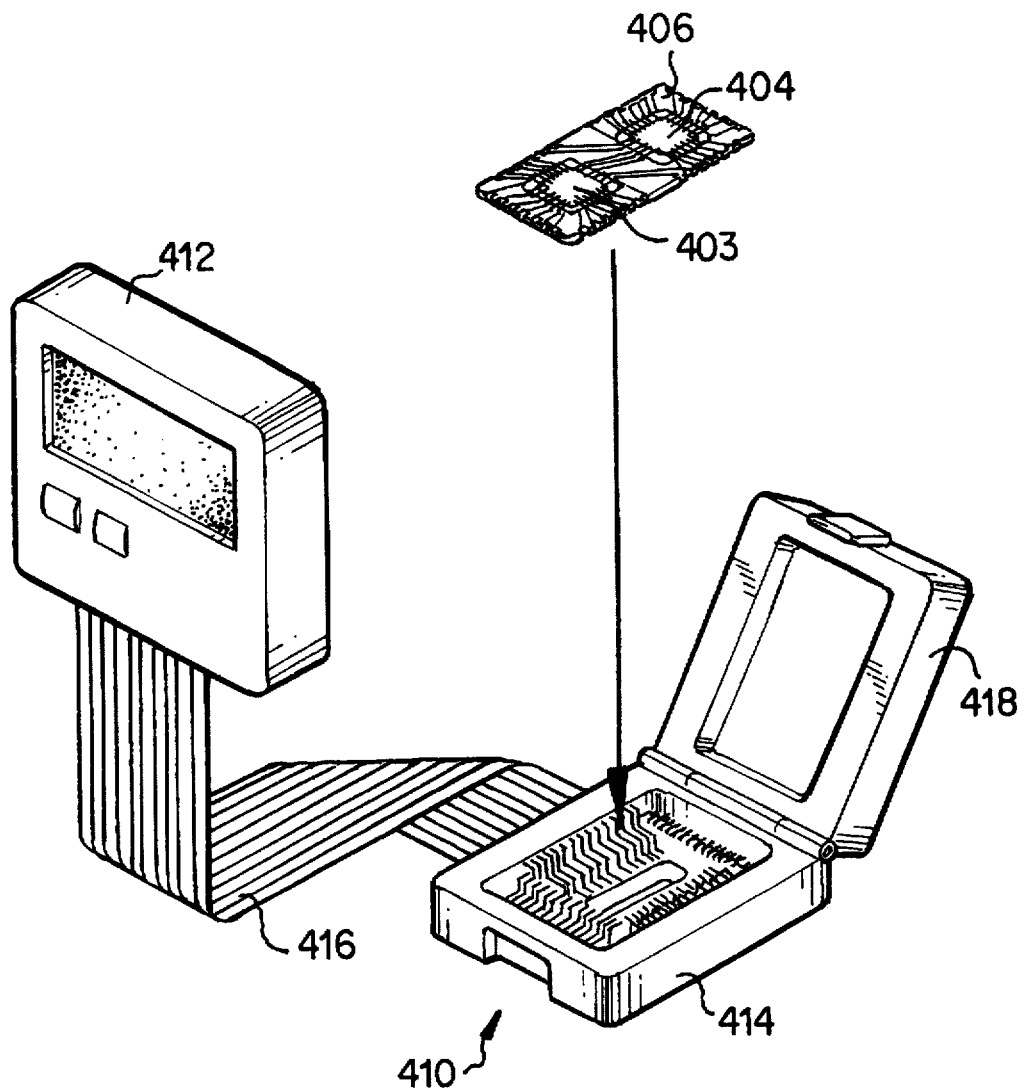
FIG. 19 is an explanatory diagram showing the configuration of a PROM writer that writes data in a sub-PW board.

Terminals 408 are formed in the perimeter of the sub-PW board 406. As for the EEPROMs 403 and 404 as well as the CPU 405, bare chips are mounted on the sub-PW board 406 and then sealed (molded) with a resin. Thereafter, data are written in the EEPROMs 403 and 404. A PROM writer is used to write data. A PROM writer 410 employed for this embodiment is shown in FIG. 19.

The PROM writer 410 comprises a main unit 412 for controlling data writing, a socket 414 on which the sub-PW board 406 can be loaded, and a cable 416 for connecting the main unit 412 and socket 414. The socket 414 has terminals 425 (see FIG. 20) that come into contact with the terminals 408 on the sub-PW board 406 and that realize electrical coupling between the sub-PW board 406 and main unit 412. When a cover 418 of the socket 414 is closed, the terminals 408 of the sub-PW board 406 come into contact with the terminals 425 without fail.

Figure 20:
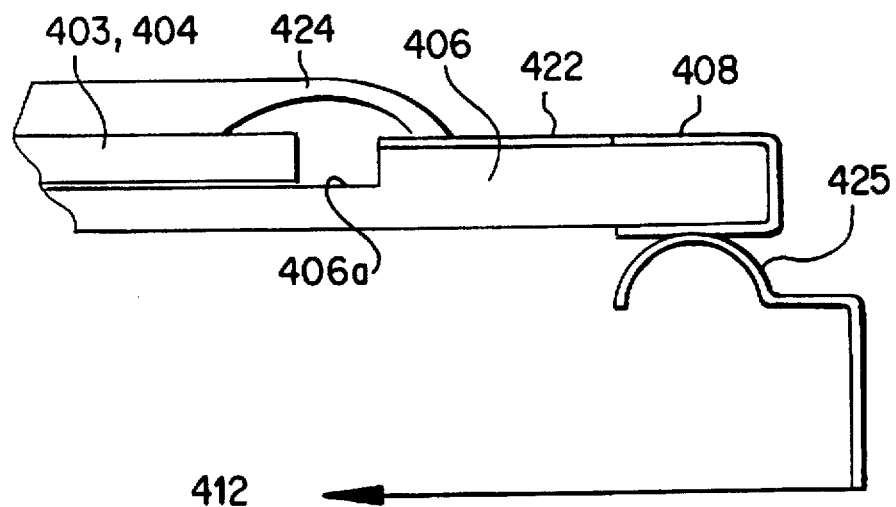
FIG. 20 is an explanatory diagram showing the connection between the sub-PW board and a socket.

FIG. 20 is a sectional view showing a state in which the terminals are joined to one another with the sub-PW board 406 loaded in the socket 414. The resin used for sealing the EEPROMs 403 and 404 is not illustrated. As shown in FIG. 20, the thickness of a region 406a of the sub-PW board 406, in which the EEPROMS 403 and 404 are to be mounted, is half of the thickness of the other portions thereof. This contributes to the minimized overall thickness. The EEPROMs 403 and 404 are mounted in the region 406a. Gold wires 424 are used to join the bumps of the EEPROMs 403 and 404 and the leads 422 of the terminals 408.

Figure 21:
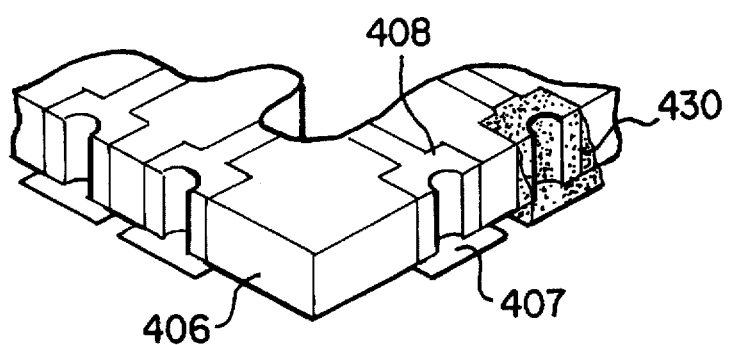
FIG. 21 is an oblique view showing a soldered state of part of the sub-PW board and a main PW board.

The sub-PW board 406 is loaded in the socket 414, and then the main unit 412 is actuated. Thus, a BIOS, which is necessary for operating an electronic device 400 and is preprogrammed, is programmed by writing in specified areas in the EEPROMs 403 and 404 on the sub-PW board 406. The sub-PW board 406 is then unloaded from the socket 414. The sub-PW board 406 is then placed on the main PW board 402 so that the connection terminals 408 will align with the pads 407 on the main PW board 402. The terminals 408 and pads 407 are then soldered together. FIG. 21 shows a soldered state. The terminals 408 are joined and fixed to the pads 407 on the main PW board 402 with solder 430.

Figure 22:
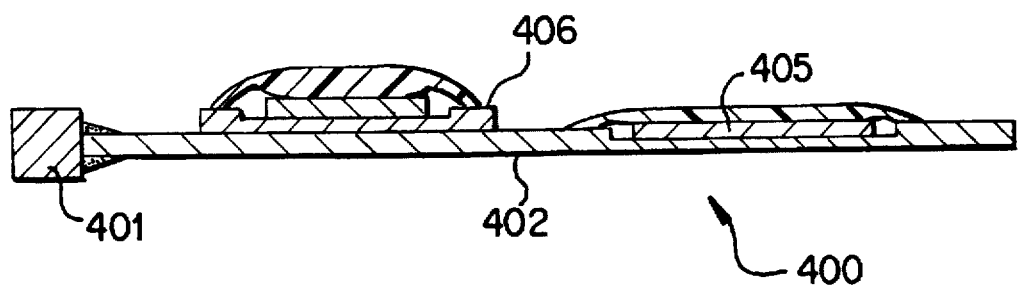
FIG. 22 is a sectional diagram showing the structure of the electronic device.

FIG. 22 is a sectional view of the electronic device 400 of this embodiment that is completed by attaching the sub-PW board 406 to the main PW board 402. A casing is not illustrated. As shown in FIG. 22, the region of the main PW board 402, on which the CPU 405 is to be mounted, has a thickness that is half of the thickness of the other regions. This contributes to the reduced overall thickness. The sum of the thickness of the mounted CPU 405, which is a bare chip, and the thicknesses of the sealing resin and main PW board 402 is about one-third of the thickness of a normal package.

In the aforesaid electronic device 400 of this embodiment, EEPROMS, which are connected by means of wire bonding, are mounted on the sub-PW board 406. If the wire bonding were defective, the sub-PW board 406 alone would be replaced with a new one. When EEPROMS are subjected to wire bonding on the main PW board 402, whether the wire bonding is defective cannot be determined until all component parts are assembled. In such a case, the entire PW board 402 would need replacement. In this embodiment, since component parts to be connected by means of wire bonding are integrated in the sub-PW board 406, whether or not the wire bonding is acceptable can be determined on the stage of the sub-PW board 406. If wire bonding is defective, the sub-PW board 406 alone should be replaced with a new one.

EEPROMs cannot, in principle, be written data while they are still bare chips. Nevertheless, when the EEPROMs are mounted on the sub-PW board 406, the overall thickness can be reduced and data can be written readily. Despite the use of EEPROMs, the very thin electronic device 400 has thus been materialized. In this embodiment, what are mounted an a sub-PW board are EEPROMS. Needless to say, this embodiment can apply to all elements that cannot undergo electrical forming while they are still bare chips or until they are sealed with a resin; such as, a control chip that needs reprogramming.

Figure 23A:
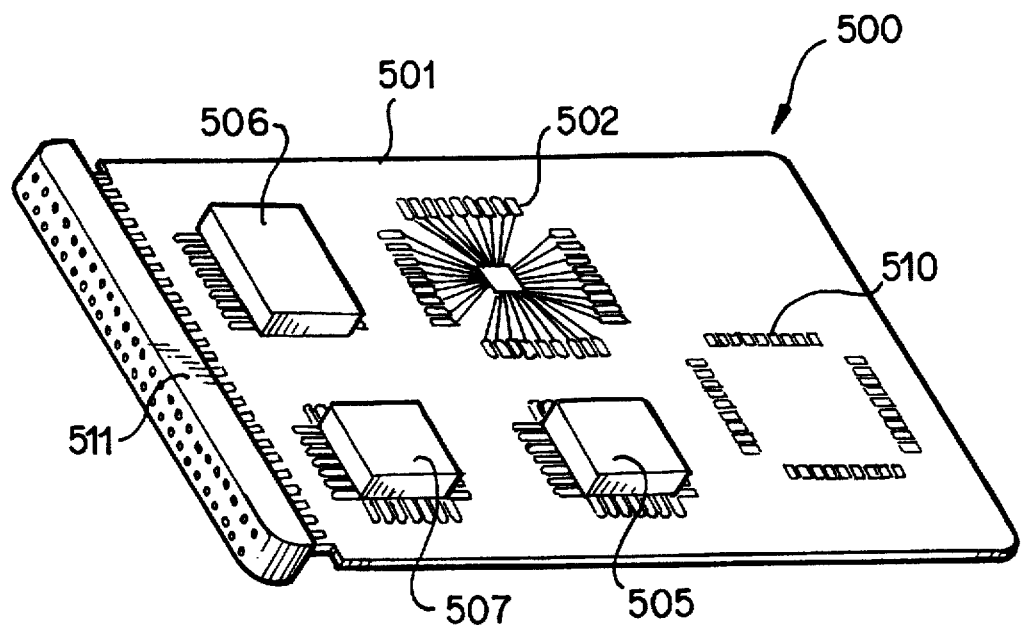
FIG. 23 is an explanatory diagram for explaining the configuration of an electronic device representing another variant of the invention.
Figure 23B:
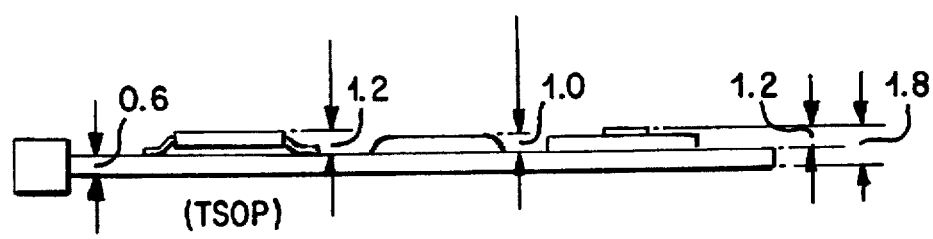

Next, another variant will be described. FIG. 23 is an explanatory diagram showing a state in which all the chips configuring a system are mounted on a main PW board 501 of an electronic device 500 in a variant of the present invention. The electronic device 500 is formed with the main PW board 501 on which a CPU 502 that is similar to the one in the first embodiment is mounted in the form of a bare chip, a gate array 505 in which a logic circuit for controlling the timing of reading or writing from or in a memory is stowed in the form of a quad flat package (QFP), a static RAM 506 provided in the form of a top small outline package (TSOP), and a gate array or an IC 507, which controls data transfer to or from external equipment and is provided in the form of a QFP, are mounted. A connector 511 to be joined with an external connector is formed on an edge of the main PW board 501. Pads 510 are formed, to which another PW board 520 (see FIG. 24) containing EEPROMs is soldered.

Figure 24:
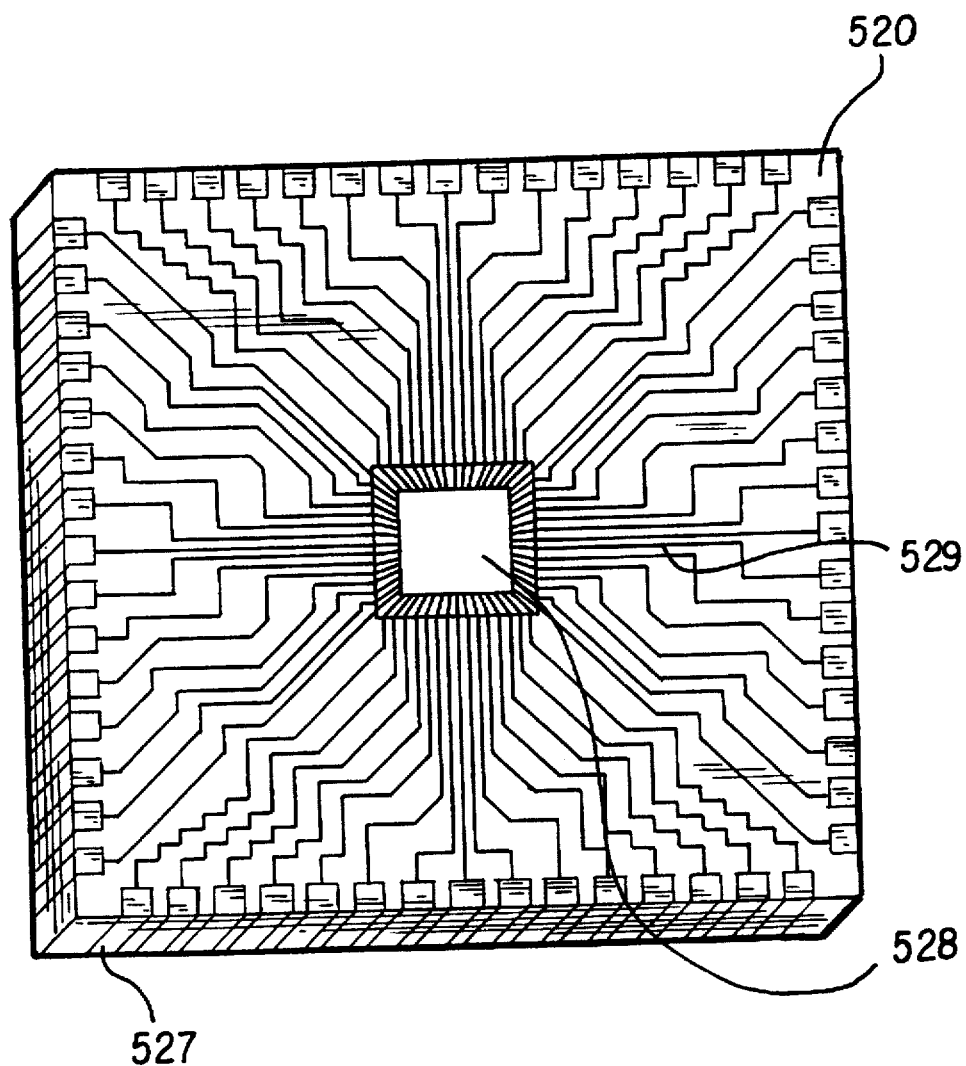
FIG. 24 is an explanatory diagram showing the patterns of another PW board in a variant of the invention.

The PW board 520 has, as shown in FIG. 24, a rectangular shape having the same size as a normal plastic lead chip carrier (PLCC) package. Terminals 527 are formed on four sides of the PW board 520. The terminals 527 are arranged to have the same pitch and layout as those in the PLCC package. In the center of the PW board 520, similar to that in the aforesaid variant (see FIG. 20), an EEPROM 528 is mounted in the form of a bare chip. Wires 529 are laid by means of wire bonding, thus joining pads on the EEPROM 528 and lines on the PW board. Signal lines terminating at the terminals 527 on the PW board 520 are laid out in the same manner as those in a normal PLCC-packaged EEPROM.

The PW board 520 can therefore be loaded in a locally-procurable PROM writer as it is. After mounted in the PW board 520 and sealed with a resin, the EEPROM 528 is loaded in the PROM writer so that it will be written necessary data. The PW board 520 is then soldered to the pads on the main PW board 501. Although an EEPROM, which cannot by nature undergo electrical forming until it is sealed with a resin, is employed, the EEPROM can be written data readily and mounted very thinly. As shown in the bottom of FIG. 23, the maximum thickness of this variant is 1.8 mm. Thus, this variant not only clears the shape standard of Type 2 (card thickness: 5 mm), Version 2 stipulated by the PC Memory Card International Standardization Committee (PCMCIA) but also satisfies the standard of Type I (card thickness: 3.3 mm).

Several embodiments of the present invention have been described so far. The present invention is not limited to these embodiments. The present invention can be implemented in various working modes without departing from the scope of the invention; such as, in a mode in which two or more connectors are included or a mode in which a plurality of electronic devices are organically joined to one another to provide an advanced facility. The thickness of a card-type electronic device is not limited to 3.3 mm but may be 3.8 or 5.5 mm, for example.

As described above, the first electronic device of the present invention has a small card-like casing. A connector connected to a control bus and an IO bus is formed on one side of the casing. This exerts the effect that a computer system can be generalized in terms of shape. Specifically, a computer to be incorporated in an equipment need not be designed one by one. The labor of development and design can therefore be saved drastically. Computer systems having the same architecture can be used commonly, which enables sharing of peripheral equipment. This is quite advantageous.

In the second electronic device of the present invention, at least one of system component elements is mounted on a PW board in the form which the element assumed before being sealed within a resin package, and then sealed with a resin. This exerts the effect that the overall thickness of a PW board, on which all system component elements are mounted, can be minimized. Furthermore, a system component element is sealed with a resin after being mounted on a sub-PW board that has a structure enabling connection to an apparatus used for performing electrical forming on a system component element. The sub-PW board is then placed directly on a PW board on which other system component elements are mounted. Even a system component element, which cannot by nature undergo electrical forming until it is sealed with a resin, can therefore be mounted directly on a PW board. Accordingly, the overall thickness can be reduced.

A computer according to the present invention, in which the first and second electronic devices are incorporated, can be sized very small and shaped very thinly. Furthermore, since the electronic devices possess computer functions, when the electronic devices are replaced with others, the computer functions can be upgraded or dedicated to a special purpose. Thus, a system can be configured flexibly and functions can be modified if necessary.

What is claimed is:

1. An electronic device comprising:

a flat, card-like casing encasing computer system component elements including a CPU, memories, and peripheral equipment control ICs electrically coupled to each other; said flat, card-like casing also encasing a printed wiring board, at least one of said system component elements attached to said printed wiring board in a bare form that said at least one system component element assumes before being partially sealed within a package, said at least one system component element being sealed with a resin after being attached to said printed wiring board, and wherein at least one of said system component elements is attached to a sub-printed wiring board that is independent of said printed wiring board, said sub-printed wiring board and said printed wiring board being electrically coupled with each other using a flexible member, and said sub-printed wiring board being attached to an inner surface of the casing using an adhesive.

2. An electronic device according to claim 1, wherein said at least one system component element that is sealed with said resin after being mounted on said sub-printed wiring board is a memory that stores procedures to be executed by said CPU.

* * * * *